United States Patent
Wang et al.

(10) Patent No.: US 11,445,596 B2
(45) Date of Patent: Sep. 13, 2022

(54) CIRCUIT BOARD HAVING HEAT-DISSIPATION BLOCK AND METHOD OF MANUFACTURING THE SAME

(71) Applicant: Unimicron Technology Corp., Taoyuan (TW)

(72) Inventors: Chin-Sheng Wang, Hsinchu (TW); Pei-Chang Huang, Taoyuan (TW)

(73) Assignee: Unimicron Technology Corp., Taoyuan (TW)

(*) Notice: Subject to any disclaimer, the term of this patent is extended or adjusted under 35 U.S.C. 154(b) by 0 days.

(21) Appl. No.: 17/153,856

(22) Filed: Jan. 20, 2021

(65) Prior Publication Data
US 2021/0144841 A1    May 13, 2021

Related U.S. Application Data

(63) Continuation-in-part of application No. 16/283,849, filed on Feb. 25, 2019, now abandoned.

(30) Foreign Application Priority Data

Dec. 27, 2018 (TW) .................................. 107147514

(51) Int. Cl.
*H05K 1/02* (2006.01)
*H05K 3/46* (2006.01)
*H05K 3/00* (2006.01)

(52) U.S. Cl.
CPC ......... *H05K 1/0204* (2013.01); *H05K 3/0047* (2013.01); *H05K 3/4697* (2013.01);
(Continued)

(58) Field of Classification Search
CPC .......... H05K 2201/09045; H05K 2201/09854; H05K 2201/10416; H05K 1/0206; H05K 1/184; H05K 1/183; H05K 1/021; H05K 1/0203; H05K 1/0204; H05K 7/20154; H05K 3/4602; H05K 3/4608;
(Continued)

(56) References Cited

U.S. PATENT DOCUMENTS 7,287,321 B2   10/2007   Takeuchi et al.
7,876,577 B2   1/2011   Weber et al.
(Continued)

FOREIGN PATENT DOCUMENTS

TW    I373113 B      9/2012
TW    201320833 A    5/2013
TW    201803419 A    1/2018

*Primary Examiner* — Roshn K Varghese
(74) *Attorney, Agent, or Firm* — CKC & Partners Co., LLC

(57) ABSTRACT

A circuit board includes an open substrate and a heat dissipation block. The open substrate includes a substrate body, an opening and at least one first fixing portion and at least one second fixing portion. The substrate body has a top surface and a bottom surface. The opening is in the substrate body and has a first sidewall and a second sidewall opposite to the first sidewall. The first fixing portion and the second fixing portion extends from the substrate body toward the opening, in which the first fixing portion and the second fixing portion are respectively protruded from the first sidewall and the second sidewall. The heat dissipation block is directly clamped between the first fixing portion and the second fixing portion.

9 Claims, 21 Drawing Sheets

(52) U.S. Cl.
CPC .............. *H05K 2201/09063* (2013.01); *H05K 2201/09854* (2013.01); *H05K 2201/10416* (2013.01)

(58) Field of Classification Search
CPC .. H05K 3/0044; H05K 3/4697; H05K 3/4644; H05K 1/0201–0212; H01L 2023/4081
See application file for complete search history.

(56) References Cited

U.S. PATENT DOCUMENTS

| | | | |
|---|---|---|---|
| 2006/0042078 A1* | 3/2006 | Takeuchi | H05K 1/186 29/830 |
| 2012/0080221 A1 | 4/2012 | Sekine et al. | |
| 2012/0287586 A1 | 11/2012 | Mikado et al. | |
| 2014/0083749 A1 | 3/2014 | Takizawa | |
| 2014/0104797 A1 | 4/2014 | Machida et al. | |
| 2014/0144677 A1 | 5/2014 | Wang et al. | |
| 2014/0144686 A1 | 5/2014 | Shimizu | |
| 2015/0068795 A1 | 3/2015 | Ida et al. | |
| 2016/0007468 A1 | 1/2016 | Tomikawa et al. | |
| 2018/0352646 A1 | 12/2018 | Yu et al. | |

* cited by examiner

CIRCUIT BOARD HAVING HEAT-DISSIPATION BLOCK AND METHOD OF MANUFACTURING THE SAME

CROSS-REFERENCE TO RELATED APPLICATION

This application is a Continuation-in-part of U.S. application Ser. No. 16/283,849, filed on Feb. 25, 2019, which claims priority to Taiwan Application Serial Number 107147514, filed Dec. 27, 2018, the entirety of which is incorporated by reference herein.

BACKGROUND

Field of Invention

The present disclosure relates to a circuit board having a heat dissipation block and a method of manufacturing the same.

Description of Related Art

Electronic components (e.g., chips) in a wiring structure generate heat during operation, so a heat dissipation block is usually disposed to conduct the heat generated by the electronic components to outside of the wiring structure. Copper is currently and commonly used as the heat dissipation block due to its ductility and good processability. However, the copper heat dissipation block has a high coefficient of thermal expansion (CTE), which is more susceptible to expansion and deformation when heated, and the difference in degree of thermal expansion between the components may cause a circuit board to warp.

In addition, when the heat dissipation block in the circuit board is made of a material having a low coefficient of thermal expansion and low ductility (e.g., silicon carbide), a method of manufacturing the circuit board having the heat dissipation block is to initially fix the heat dissipation block using an adhesive layer, and then to fill a resin material to fix the heat dissipation block. However, in this method, finally, the adhesive layer needs to be peeled off, and the heat dissipation block is easily displaced during the peeling process.

Therefore, there is a need for a novel method of manufacturing a circuit board having a heat dissipation block to solve the above problems.

SUMMARY

According to various embodiments of the present disclosure, circuit board is provided. The circuit board includes an open substrate and a heat dissipation block. The open substrate includes a substrate body, an opening and at least one first fixing portion and at least one second fixing portion. The substrate body has a top surface and a bottom surface. The opening is in the substrate body and has a first sidewall and a second sidewall opposite to the first sidewall. The first fixing portion and the second fixing portion extends from the substrate body toward the opening, in which the first fixing portion and the second fixing portion are respectively protruded from the first sidewall and the second sidewall. The heat dissipation block is directly clamped between the first fixing portion and the second fixing portion, in which the heat dissipation block includes ceramic or a composite material.

According to some embodiments of the present disclosure, an aperture is on the first fixing portion and the second fixing portion and between the open substrate and a top portion of the heat dissipation block, and the first fixing portion and the second fixing portion respectively have a height that is smaller than a thickness of the open substrate.

According to some embodiments of the present disclosure, a bottom portion of the heat dissipation block is tight contact with the first fixing portion and the second fixing portion.

According to some embodiments of the present disclosure, the aperture has a depth of about 0.2-0.5 of a thickness of the substrate body.

According to some embodiments of the present disclosure, the top surface of the substrate body is level with a top surface of the heat dissipation block.

According to some embodiments of the present disclosure, the first fixing portion has a first width protruding from the first sidewall, and the second fixing portion has a second width protruding from the second sidewall, in which the first width and the second width are in a range of from about 0.05 mm to about 0.5 mm.

According to some embodiments of the present disclosure, the first fixing portion has at least two first protrusions in contact with the heat dissipation block and at least one first recess located between the first protrusions and the heat dissipation block, and the second fixing portion has at least two second protrusions in contact with the heat dissipation block and at least one second recess located between the second protrusions and the heat dissipation block.

According to some embodiments of the present disclosure, the open substrate further includes at least one third fixing portion and at least one fourth fixing portion extending from the substrate body toward the opening, and the heat dissipation block is clamped between the third fixing portion and the fourth fixing portion.

According to some embodiments of the present disclosure, the opening has round corners at both ends of the first sidewall and the second sidewall.

According to some embodiments of the present disclosure, the heat dissipation block is selected from one of the group consisting of aluminum silicon carbide (AlSiC), tungsten copper alloy (CuW), tungsten molybdenum alloy (CuMo), silicon carbide (SiC), silicon nitride (AlN), beryllia, chemical vapor deposition diamond (CVD diamond), diamond powder-doped copper, diamond powder-doped aluminum, carbon-based nano-aluminum composite material (CarbAl-N) and carbon-based nano-aluminum composite material (CarbAl-G).

According to various embodiments of the present disclosure, a method of manufacturing a circuit board is provided. The method includes forming an open substrate, in which the open substrate includes a substrate body having a top surface and a bottom surface; an opening in the substrate body, in which the opening has a first sidewall and a second sidewall opposite to the first sidewall; and at least one first fixing portion and at least one second fixing portion extending from the substrate body toward the opening, in which the first fixing portion and the second fixing portion are respectively protruded from the first sidewall and the second sidewall. The heat dissipation block is then inserted in the opening to clamp the heat dissipation block between the first fixing portion and the second fixing portion, in which the heat dissipation block includes the heat dissipation block comprises a ceramic or a composite material.

According to some embodiments of the present disclosure, the method further includes recessing the first fixing portion and the second fixing portion to form an cavity; and placing a heat dissipation block in the cavity.

According to some embodiments of the present disclosure, the cavity has a width of about 1.03-1.1 of a length of the heat dissipation block.

According to some embodiments of the present disclosure, the cavity has a depth of about 0.2-0.5 of the thickness of the substrate body.

According to some embodiments of the present disclosure, the heat dissipation block is supported by the first fixing portion and the second fixing portion when placing the heat dissipation block in the cavity.

According to some embodiments of the present disclosure, the heat dissipation block has a length that is greater than a distance between the first fixing portion and the second fixing portion.

According to some embodiments of the present disclosure, a top surface of the heat dissipation block is protruded from the top surface of the substrate body when placing the heat dissipation block in the cavity.

According to some embodiments of the present disclosure, inserting the heat dissipation block in the opening comprises pressing from a top surface of heat dissipation block to squeeze the heat dissipation block into the opening between the first fixing portion and the second fixing portion.

According to some embodiments of the present disclosure, the open substrate further includes at least one third fixing portion and at least one fourth fixing portion extending from the substrate body toward the opening, and the heat dissipation block is clamped between the third fixing portion and the fourth fixing portion.

According to some embodiments of the present disclosure, the heat dissipation block is selected from one of the group consisting of aluminum silicon carbide (AlSiC), tungsten copper alloy (CuW), tungsten molybdenum alloy (CuMo), silicon carbide (SiC), silicon nitride (AlN), beryllia, chemical vapor deposition diamond (CVD diamond), diamond powder-doped copper, diamond powder-doped aluminum, carbon-based nano-aluminum composite material (CarbAl-N) and carbon-based nano-aluminum composite material (CarbAl-G).

BRIEF DESCRIPTION OF THE DRAWINGS

Various aspects of the present disclosure will be fully understood from the following detailed description when reading the accompanying drawings. It is worth noting that various features are not drawn to scale in accordance with standard practice in the industry. In fact, dimensions of the various features may be arbitrarily increased or decreased for clarity of discussion.

DETAILED DESCRIPTION

Figure 1:
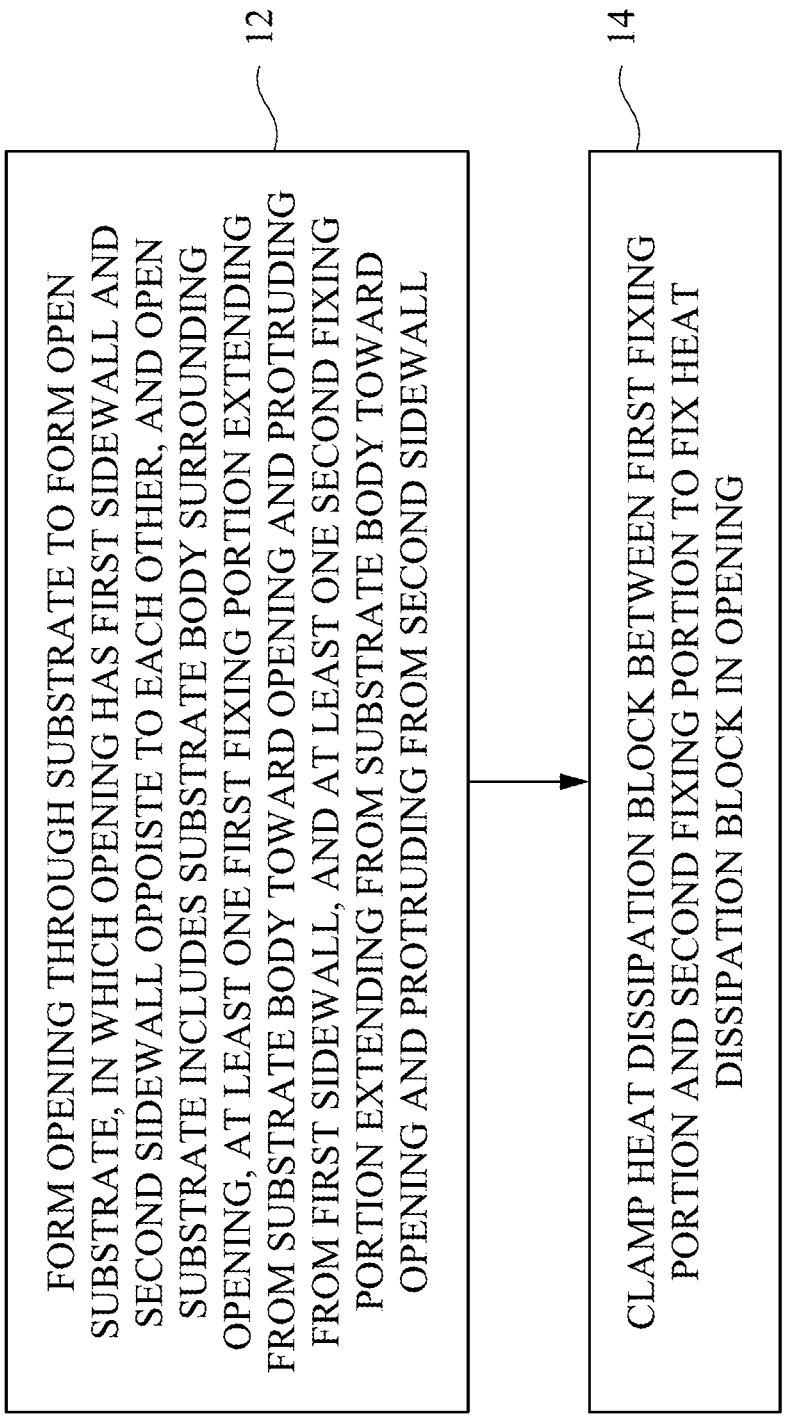
FIG. 1 is a flow chart of a method of manufacturing a circuit board having a heat dissipation block according to various embodiments of the present disclosure.

The drawings disclose a plurality of embodiments of the present disclosure below. For the sake of clarity, many practical details will be explained in the following description. However, it should be understood that these practical details are not intended to limit the present disclosure. That is, in some embodiments of the present disclosure, these practical details are not necessary. Moreover, for the sake of simplicity of the drawings, some conventional structures and elements will be illustrated in a simplified schematic manner in the drawings.

In the description, spatially relative terms, such as "beneath," "below," "over," "on," and the like, may be used herein for ease of description to describe one element or feature's relationship to another element(s) or feature(s) as shown in the figures. The true meaning of the spatially relative terms includes other orientations. For example, when the figure is flipped up and down by 180 degrees, the relationship between one component and another component may change from "beneath" or "below," to "over" or "on." In addition, the spatially relative descriptions used herein should be interpreted the same.

Although a series of operations or steps are described below to illustrate the methods disclosed herein, the order of the operations or steps is not to be construed as limiting. For example, certain operations or steps may be performed in a different order and/or concurrently with other steps. In addition, not all illustrated operations, steps and/or features are required to implement embodiments of the present disclosure. Moreover, each of the operations or steps described herein can include a number of sub-steps or actions.

FIG. 1 is a flow chart of a method 10 of manufacturing a circuit board having a heat dissipation block according to various embodiments of the present disclosure. As shown in FIG. 1, the method 10 includes operations 12 and 14. FIGS. 2-8 are top views of a manufacturing method at various stages according to some embodiments of the present disclosure.

Figure 2:
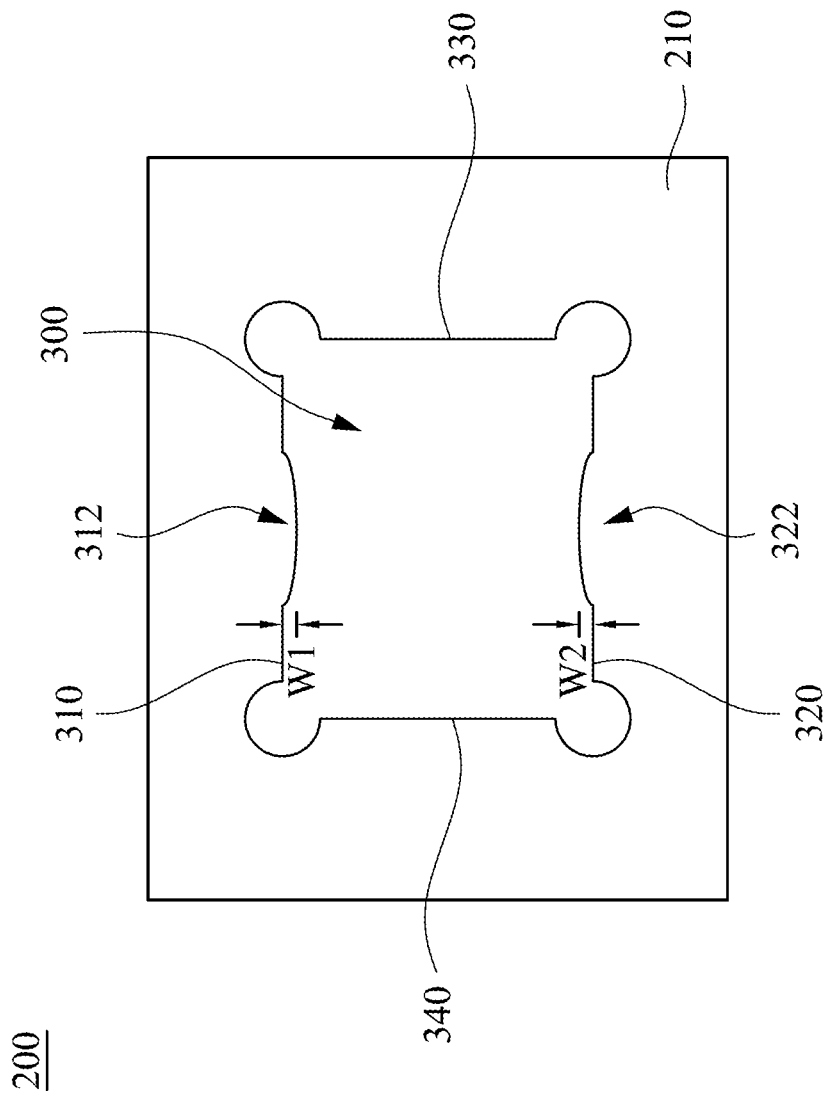
FIGS. 2-8 are top views of a manufacturing method at various stages according to some embodiments of the present disclosure.
Figure 3:
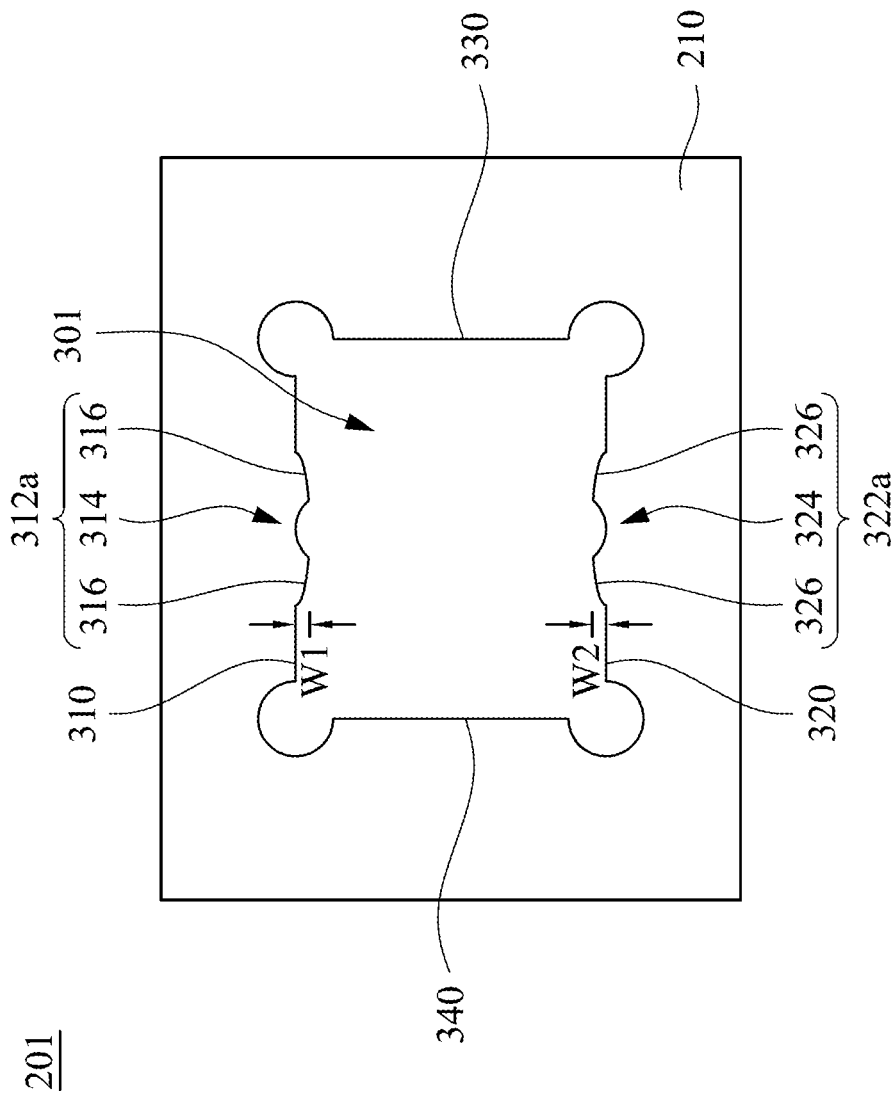

Referring to FIGS. 1 and 2, in the operation 12 of the method 10, an opening 300 is formed through a substrate 100 to form an open substrate 200, in which the opening 300 has a first sidewall 310 and a second sidewall 320 opposite to each other. The open substrate 200 includes a substrate body 210 surrounding the opening 300, at least one first fixing portion 312 extending from the substrate body 210 toward the opening 300 and protruding from the first sidewall 310, and at least one second fixing portion 322 extending from the substrate body 210 toward the opening 300 and protruding from the second sidewall 320. In various embodiments, the substrate 100 includes an insulating plate, a metal plate, or a wiring board, but is not limited thereto. In some embodiments, the substrate 100 may be a multi-layered circuit board. In some embodiments, the process of forming the opening 300 may include drilling, laser, routing, punching, or a combination thereof, but is not limited thereto. In some embodiments, the opening 300 may be directly formed using the punching process. In some embodiments, four corners of the opening 300 have an arc-shaped profile recessed toward the substrate body 210, as shown in FIG. 2.

In some embodiments, the first fixing portion 312 has a first width W1 protruding from the first sidewall 310, and the second fixing portion 322 has a second width W2 protruding from the second sidewall 320, and the first width W1 and the second width W2 are in a range of from about 0.05 mm to about 0.5 mm. The protruding first fixing portion 312 and the second fixing portion 322 may be used to fix the heat dissipation block disposed in the opening in subsequent processes.

In some embodiments, the opening 300 further has a third sidewall 330 and a fourth sidewall 340 opposite to each other, and the third sidewall 330 and the fourth sidewall 340 are connected to the first sidewall 310 and the second sidewall 320. It should be noted that although the first fixing portion 312 and the second fixing portion 322 respectively protrude from the longer first sidewall 310 and the second sidewall 320 of the opening 300, the present disclosure is not limited thereto. The first fixing portion 312 and the second fixing portion 322 may be disposed at the shorter third sidewall 330 and the fourth sidewall 340 of the opening 300, respectively.

FIGS. 3-7 are top views of open substrates 201, 202, 203, 204, and 205 according to other embodiments of the present disclosure. Firstly, referring to FIG. 3, the difference between the open substrate 201 and the open substrate 200 is that the first fixing portion 312a of the open substrate 201 has at least two first protrusions 316 and at least one first recess 314 located between the first protrusions 316, and the second fixing portion 322a has at least two second protrusions 326 and at least one second recess 324 located between the second protrusions 326. In some embodiments, each of the first protrusions 316 may be aligned with one of the second protrusions 326 to stably fix the heat dissipation block in subsequent processes. In some embodiments, the first recess 314 and the second recess 324 may be formed using a drilling process. In more detail, in some embodiments, the first fixing portion 312 and the second fixing portion 322 shown in FIG. 2 may be respectively drilled to form the first fixing portion 312a and the second fixing portion 322a shown in FIG. 3.

Figure 4:
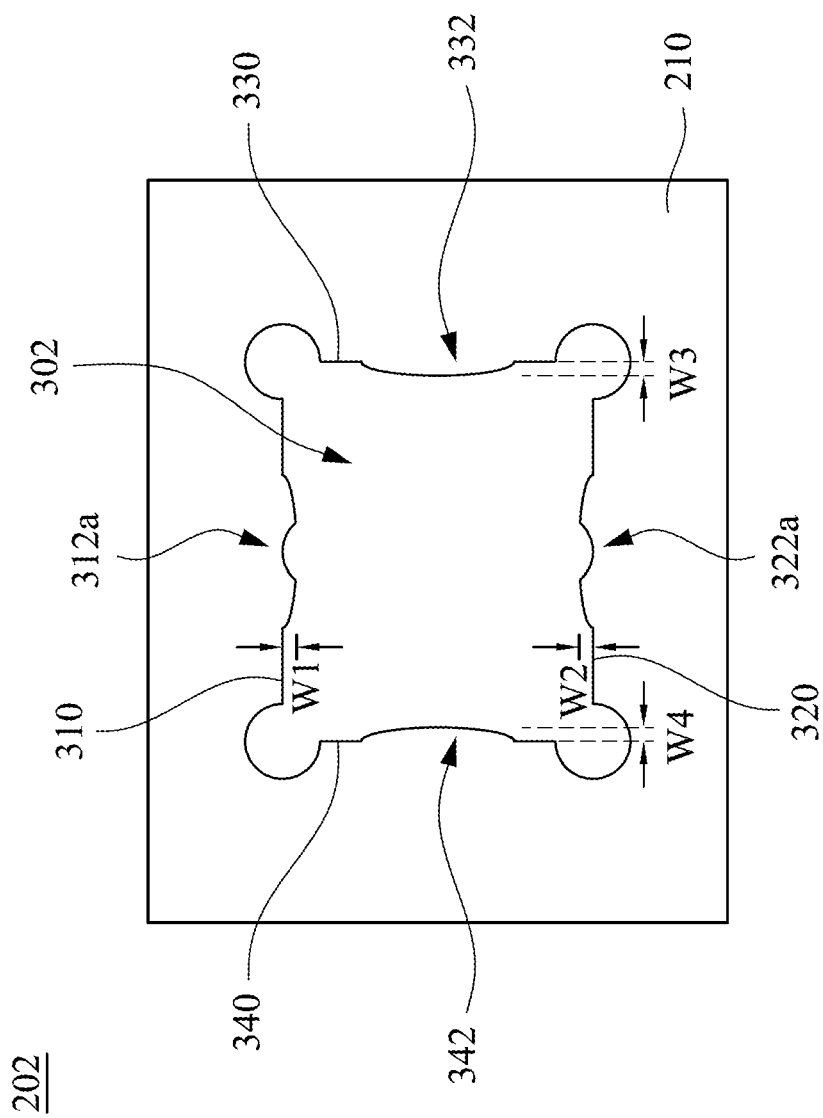

Referring to FIG. 4, the difference between the open substrate 202 and the open substrate 201 is that the open substrate 202 further has at least one third fixing portion 332 and at least one fourth fixing portion 342. The third fixing portion 332 extends from the substrate body 210 of the open substrate 202 toward the opening 302 and protrudes from the third sidewall 330. The fourth fixing portion 342 extends from the substrate body 210 of the open substrate 202 toward the opening 302 and protrudes from the fourth sidewall 340. In some embodiments, the third fixing portion 332 has a third width W3 protruding from the third sidewall 330, and the fourth fixing portion 342 has a fourth width W4 protruding from the fourth sidewall 340, and the third width W3 and the fourth width W4 are in a range of from about 0.05 mm to about 0.5 mm. In some embodiments, the third width W3 and the fourth width W4 may be the same as the first width W1 and the second width W2. In other embodiments, the third width W3 and the fourth width W4 may be different from the first width W1 and the second width W2.

Figure 5:
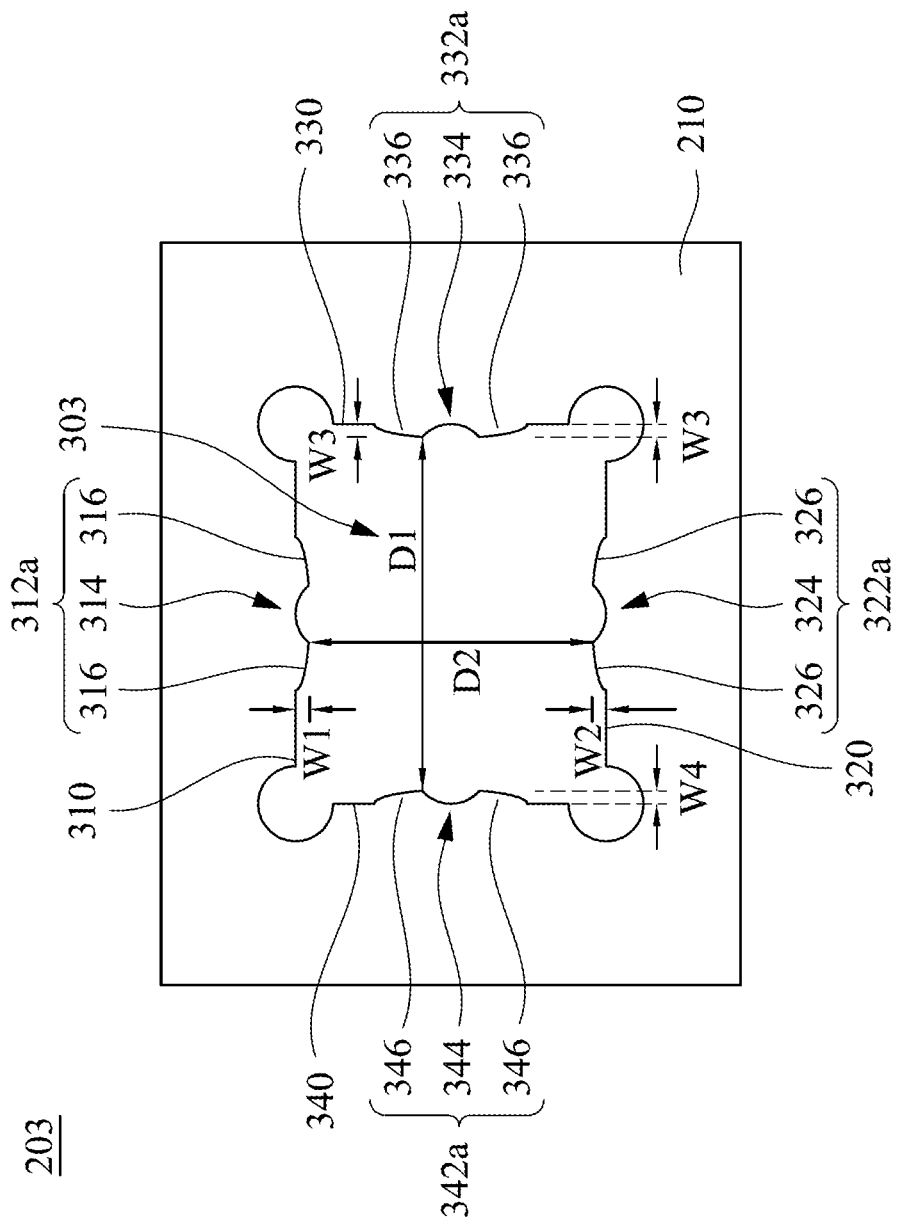

Referring to FIG. 5, the difference between the open substrate 203 and the open substrate 202 is that the third fixing portion 332a of the open substrate 203 has at least two third protrusions 336 and at least one third recess 334 located between the third protrusions 336, and the fourth fixing portion 342a has at least two fourth protrusions 346 and at least one fourth recess 344 located between the fourth protrusions 346. In some embodiments, the third protrusion 336 has a third width W3 protruding from the third sidewall 330, and the fourth protrusion 346 has a fourth width W4 protruding from the fourth sidewall 340, and the third width W3 and the fourth width W4 are in a range of from about 0.05 mm to about 0.5 mm. In some embodiments, the third width W3 and the fourth width W4 may be the same as the first width W1 and the second width W2. In other embodiments, the third width W3 and the fourth width W4 may be different from the first width W1 and the second width W2. The third protrusion 336 and the fourth protrusion 346 may be used to fix the heat dissipation block disposed in the opening together with the first protrusions 316 and the second protrusions 326 in subsequent processes. In some embodiments, each of the first protrusions 316 may be aligned with one of the second protrusions 326, and each of the third protrusions 336 may be aligned with one of the fourth protrusions 346. In some embodiments, there is a distance D2 between the first fixing portion 312a and the second fixing portion 322a, and there is a distance D1 between the third fixing portion 332a and the fourth fixing portion 342a. In some embodiments, the distance D1 and the distance D2 may be the same. In other embodiments, the distance D1 and the distance D2 may be different. The distance D1 and the distance D2 may be selected according to the size of the heat dissipation block to be disposed.

Figure 6:
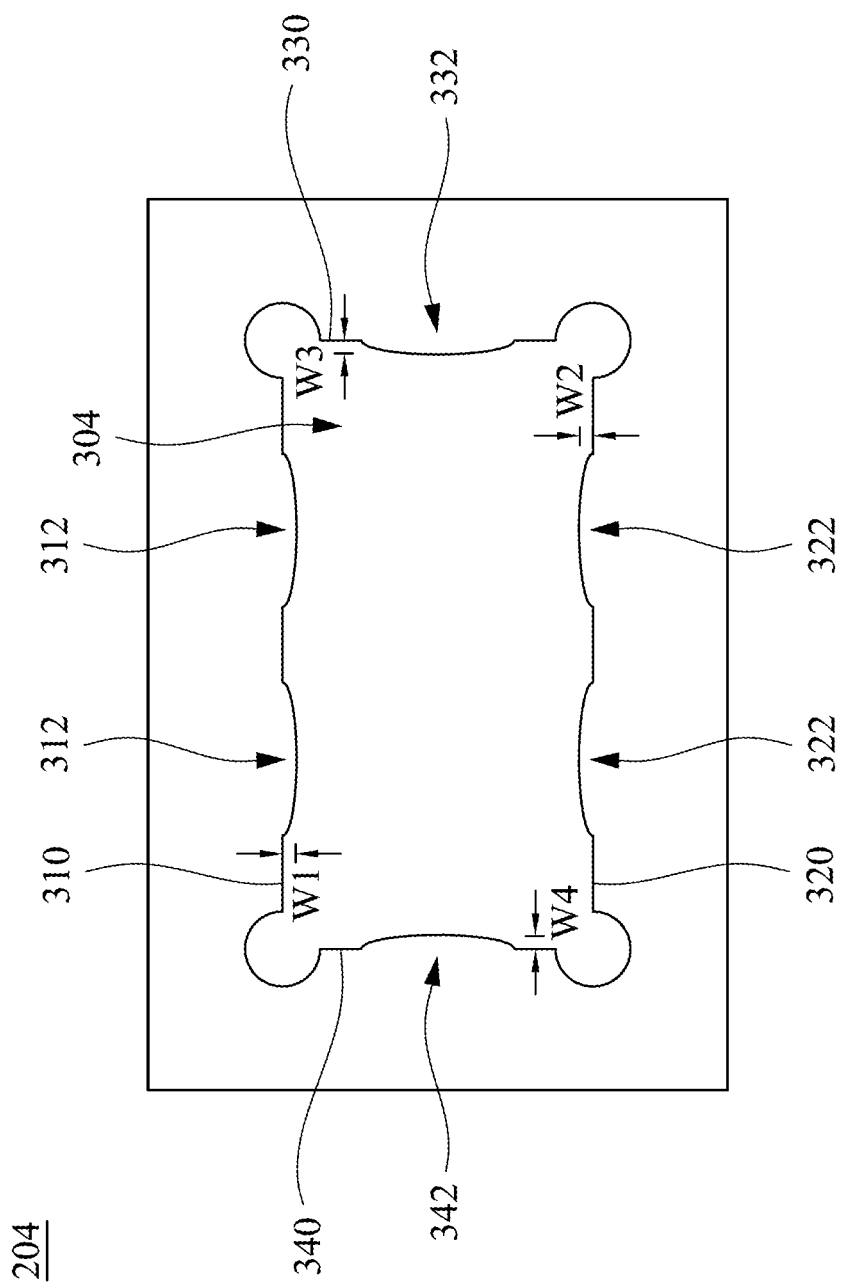

Referring to FIG. 6, the open substrate 204 has a plurality of first fixing portions 312 protruding from the first sidewall 310 of the opening 304, and a plurality of second fixing portions 322 protruding from the second sidewall 320 of the opening 304. In some embodiments, each of the first fixing portions 312 may be aligned with one of the second fixing portions 322, and the position of the third fixing portion 332 can correspond to that of the fourth fixing portion 342. In some embodiments, the width W1 of the first fixing portion 312 and the width W2 of the second fixing portion 322 in the open substrate 204 may be the same as the widths W1 and W2 in the open substrate 200, respectively, and the width W3 of third fixing portion 332 and the width W4 of the fourth fixing portion 342 may be the same as the widths W3 and W4 of the open substrate 202, respectively, and are not described herein again.

Figure 7:
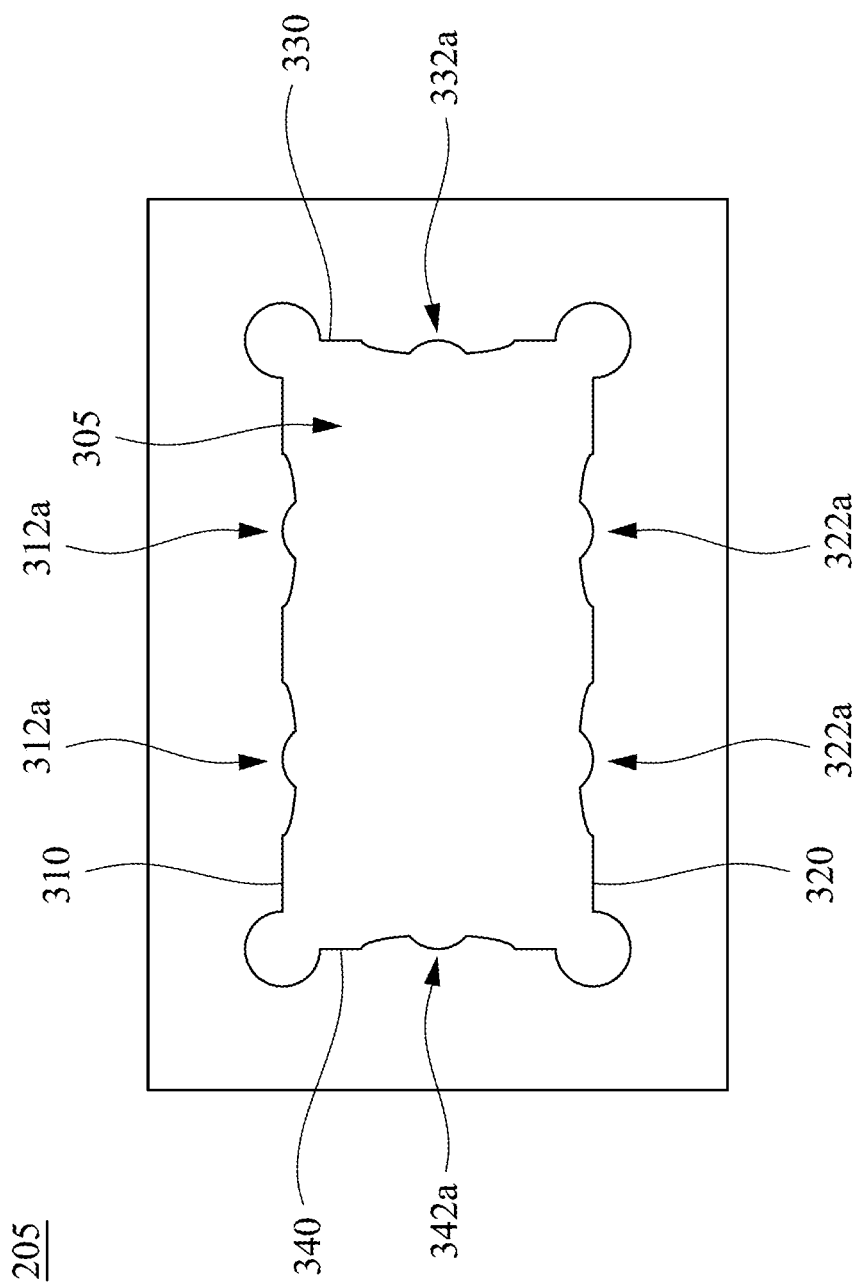

Referring to FIG. 7, the difference between the open substrate 205 and the open substrate 203 is that the open substrate 205 has a plurality of first fixing portions 312a protruding from the first sidewall 310 of the opening 305, and a plurality of second fixing portions 322a protruding from the second sidewall 320 of the opening 305. In some embodiments, each of the first fixing portions 312a may be aligned with one of the second fixing portions 322a, and the position of the third fixing portion 332a may correspond to that of the fourth fixing portion 342a. It should be noted that the number and arrangement of the first fixing portions 312, 312a, the second fixing portions 322, 322a, the third fixing portions 332, 332a, and the fourth fixing portions 342, 342a shown in FIGS. 2-7 are only examples, when the size of the opening is larger, more fixing portions may be arranged to stably fix the heat dissipation block in the opening.

Subsequent steps of the method 10 will be described below by taking the open substrate 203 shown in FIG. 5 as an example.

Figure 8:
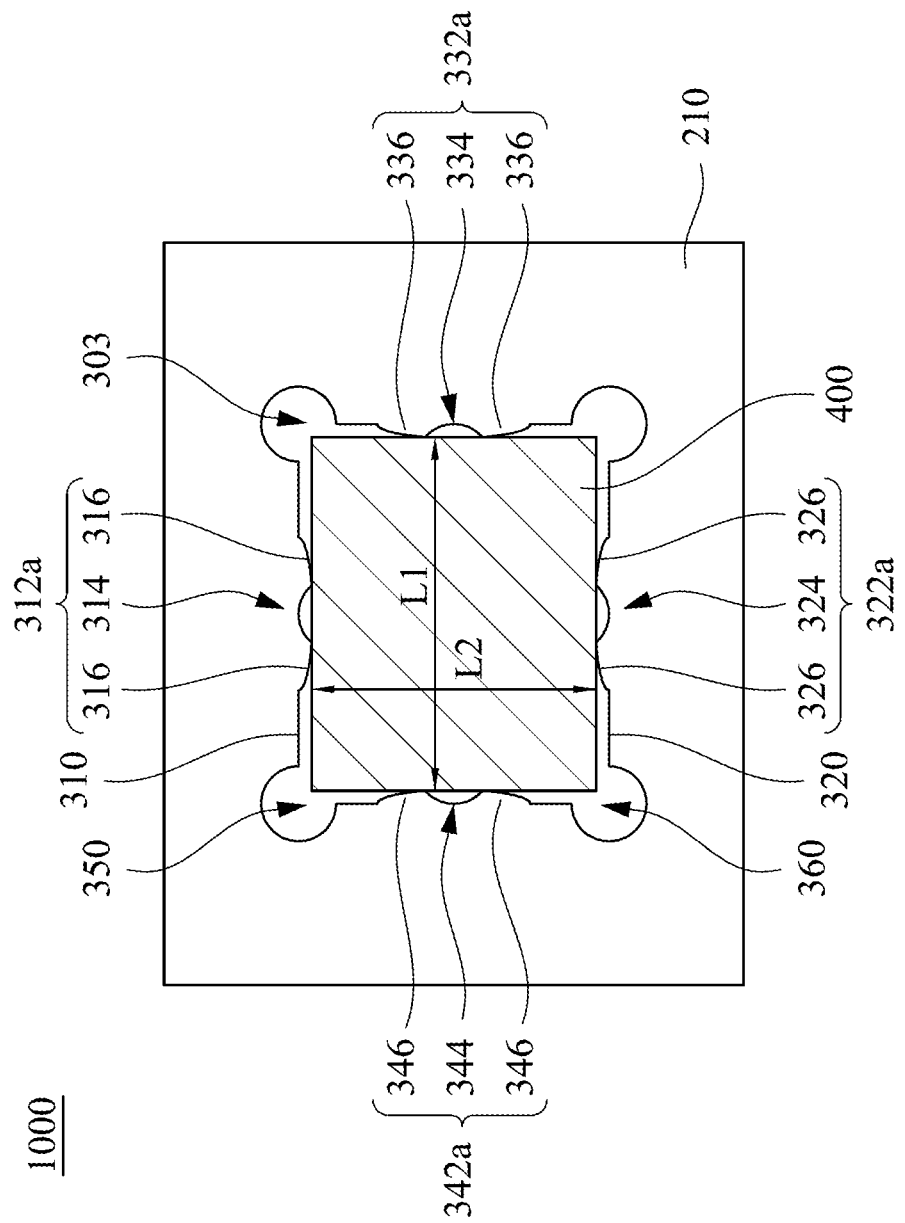

Referring to FIGS. 1 and 8, in the operation 14 of the method 10, the heat dissipation block 400 is clamped between the first fixing portion 312a and the second fixing portion 322a to fix the heat dissipation block 400 in the opening 303, such that the circuit board 1000 having the heat dissipation block is formed. In some embodiments, the first protrusion 316 of the first fixing portion 312a and the second protrusion 326 of the second fixing portion 322a are in contact with and fix the heat dissipation block 400. The first recess 314 may be located between the two first protrusions 316 and the heat dissipation block 400, and the second recess 324 may be located between the two second protrusions 326 and the heat dissipation block 400. As shown in FIG. 8, in some embodiments, when the heat dissipation block 400 is clamped between the first fixing portion 312a and the second fixing portion 322a, a first gap 350 is formed between the heat dissipation block 400 and the first sidewall 310 of the opening 303, and a second gap 360 is formed between the heat dissipation block 400 and the second sidewall 320 of the opening 303.

In various embodiments, the heat dissipation block 400 includes a ceramic or composite material. In some embodiments, the heat dissipation block 400 is selected from one of the group consisting of aluminum silicon carbide (AlSiC), tungsten copper alloy (CuW), tungsten molybdenum alloy (CuMo), silicon carbide (SiC), silicon nitride (AlN), beryllia, chemical vapor deposition diamond (CVD diamond), diamond powder-doped copper, diamond powder-doped aluminum, carbon-based nano-aluminum composite material (CarbAl-N) and carbon-based nano-aluminum composite material (CarbAl-G). In some embodiments, CuW includes 10-20% copper (Cu). In some embodiments, CuMo includes 15-20% molybdenum (Mo). In some embodiments, the heat dissipation block 400 includes aluminum nitride, aluminum carbide, aluminum silicon carbide, or a combination thereof, but is not limited thereto. The heat dissipation block 400 may be other materials having a low coefficient of thermal expansion (e.g., less than 10 ppm/K) and low ductility. In some embodiments, the heat dissipation block 400 may have a metal layer (not shown in FIG. 8) formed using a sputtering and/or plating process on its upper and lower surfaces. The working heat source generated by the electronic components on the circuit board may be transmitted to outside of the circuit board through heat conduction characteristics of the heat dissipation block 400 to maintain working performance of the electronic components and maintain their life. In some embodiments, the heat dissipation block 400 is rectangular-shaped. In some embodiments, the heat dissipation block 400 has a length L2 slightly larger than the distance D2 between the first fixing portion 312a and the second fixing portion 322a (shown in FIG. 5). The heat dissipation block 400 may be fixed in the opening 303 by the length L2 of the heat dissipation block 400 being slightly larger than the distance D2.

In other embodiments, the heat dissipation block 400 may also be clamped between the third fixing portion 332a and the fourth fixing portion 342a. As shown in FIG. 8, the third protrusions 336 of the third fixing portion 332a and the fourth protrusions 346 of the fourth fixing portion 342a are in contact with and fix the heat dissipation block 400. The third recess 334 is located between the two third protrusions 336 and the heat dissipation block 400, and the fourth recess 344 is located between the two fourth protrusions 346 and the heat dissipation block 400. In some embodiments, the heat dissipation block 400 has a length L1 slightly larger than the distance D1 between the third fixing portion 332a and the fourth fixing portion 342a (shown in FIG. 5). The heat dissipation block 400 may be fixed in the opening 303 by the length L1 of the heat dissipation block 400 being slightly larger than the distance D1.

Figure 9:
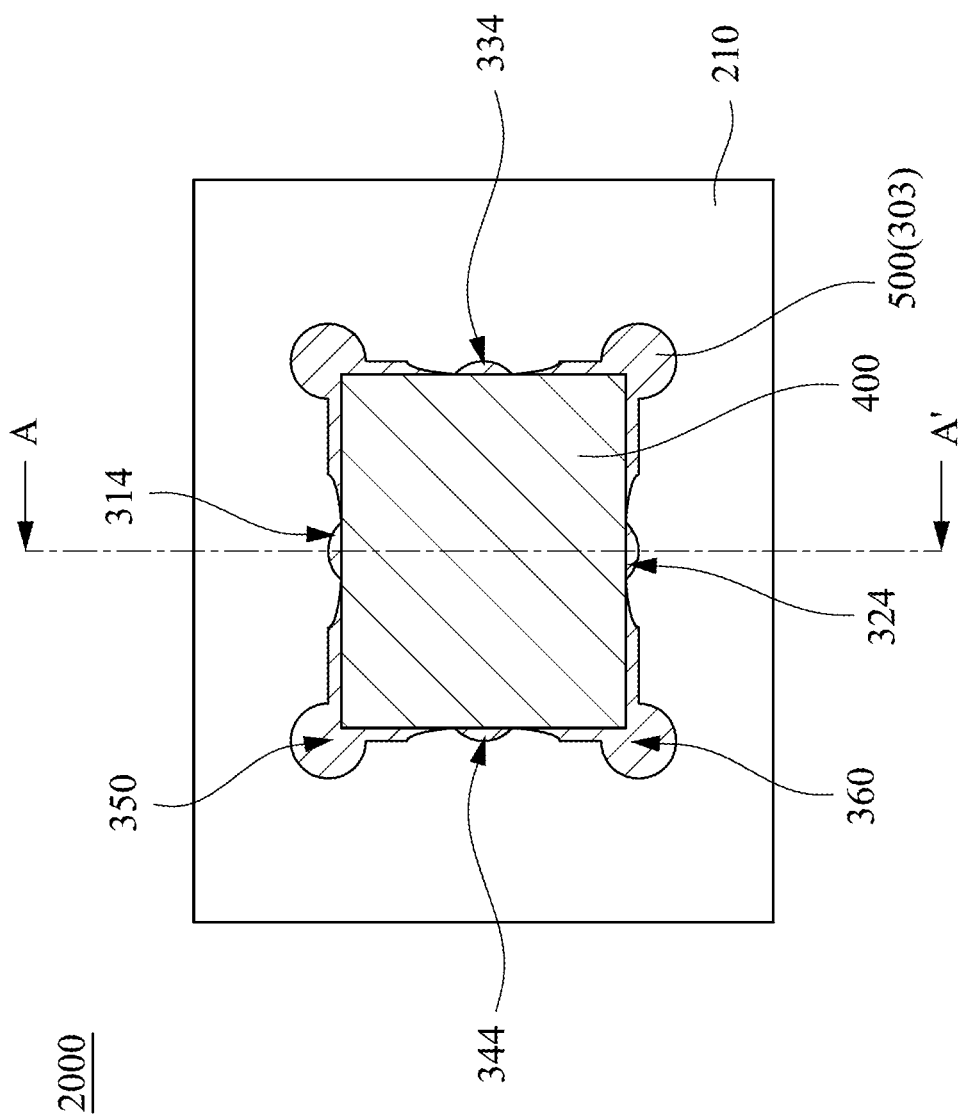
FIG. 9 is a top view of a circuit board having a heat dissipation block according to some embodiments of the present disclosure.
Figure 10:
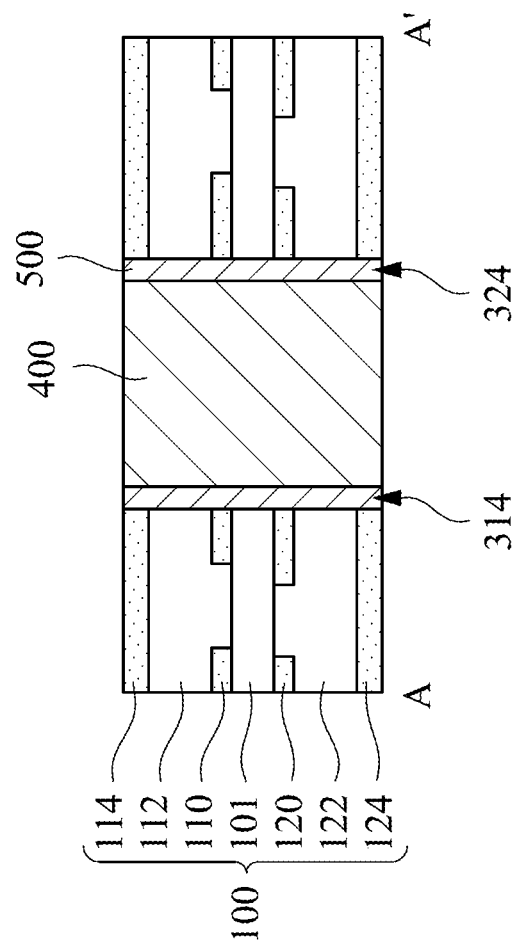
FIG. 10 is a cross-sectional view of the circuit board having the heat dissipation block taken along line A-A of FIG. 9.

In one embodiment, after the operation 14 is completed, the method 10 may include other operations or steps, as shown in FIGS. 9-10. Firstly, referring to FIG. 9, which is a top view of a process stage after the operation 14 according to some embodiments of the present disclosure. In some embodiments, the method 10 further includes filling a resin material 500 in the first gap 350, the second gap 360, the first recess 314, and the second recess 324. In other embodiments, the method 10 further includes filling the resin material 500 in the third recess 334 and the fourth recess 344. As shown in FIG. 9, after the operation 14, all of the gaps between the heat dissipation block 400 and the open substrate 203 may be filled with the resin material 500, so that the heat dissipation block 400 is fixed in the opening 303 to facilitate subsequent processes performed on the circuit board 2000.

Referring to FIG. 10, which is a cross-sectional view taken along line A-A of FIG. 9. In some embodiments, the circuit board 2000 may be a multi-layered circuit board. For example, the substrate 100 of the circuit board 2000 includes a core plate 101, a first circuit layer 110, a second circuit layer 120, a first dielectric layer 112, a second dielectric layer 122, a first conductive layer 114, and a second conductive layer 124. It should be understood that the structure of the substrate 100 is not limited to that shown in FIG. 10, and the substrate 100 may be any circuit board having a multilayered structure.

Figure 11:
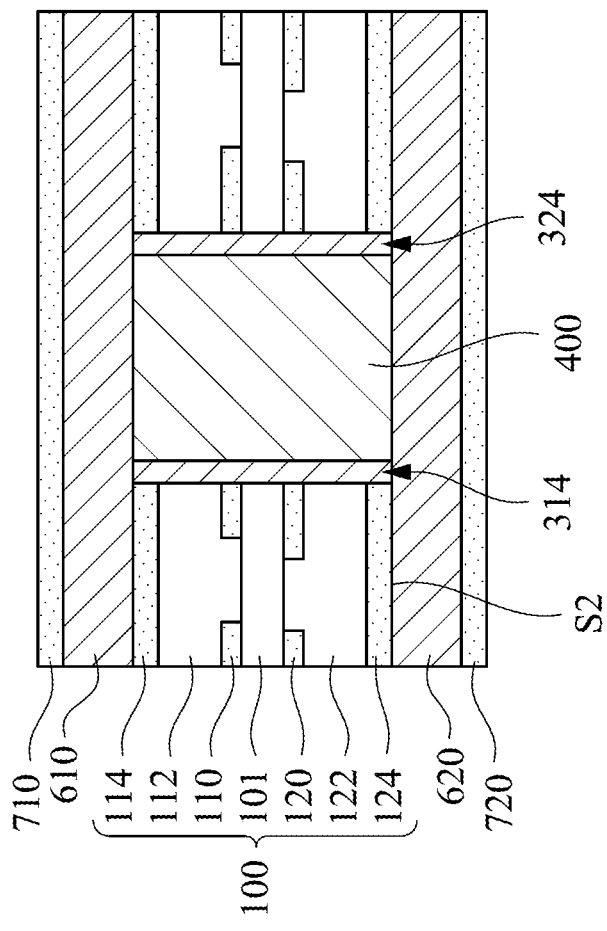
FIG. 11 is a cross-sectional view of a circuit board having a heat dissipation block according to some embodiments of the present disclosure.

In another embodiment, after the operation 14 is completed, the method 10 further includes forming a third dielectric layer 610 and a fourth dielectric layer 620 over a top surface S1 and a bottom surface S2 of the substrate 100, respectively, forming a third conductive layer 710 over the third dielectric layer 610, and forming a fourth conductive layer 720 beneath the fourth dielectric layer 620, as shown in FIG. 11. FIG. 11 is a cross-sectional view of a process stage after the operation 14 according to other embodiments of the present disclosure. In some embodiments, the third dielectric layer 610 and the fourth dielectric layer 620 may be prepregs or other dielectric materials having fluidity. As shown in FIG. 11, the third dielectric layer 610 and the fourth dielectric layer 620 may be filled in the first recess 314 and the second recess 324. In some embodiments, the third dielectric layer 610 and the fourth dielectric layer 620 may also fill all of the gaps between the heat dissipation block 400 and the open substrate 203 shown in FIG. 8, such as the first gap. 350, the second gap 360, the third recess 334, and the fourth recess 344. In some embodiments, the third conductive layer 710 and the fourth conductive layer 720 may be copper foils.

Figure 12:
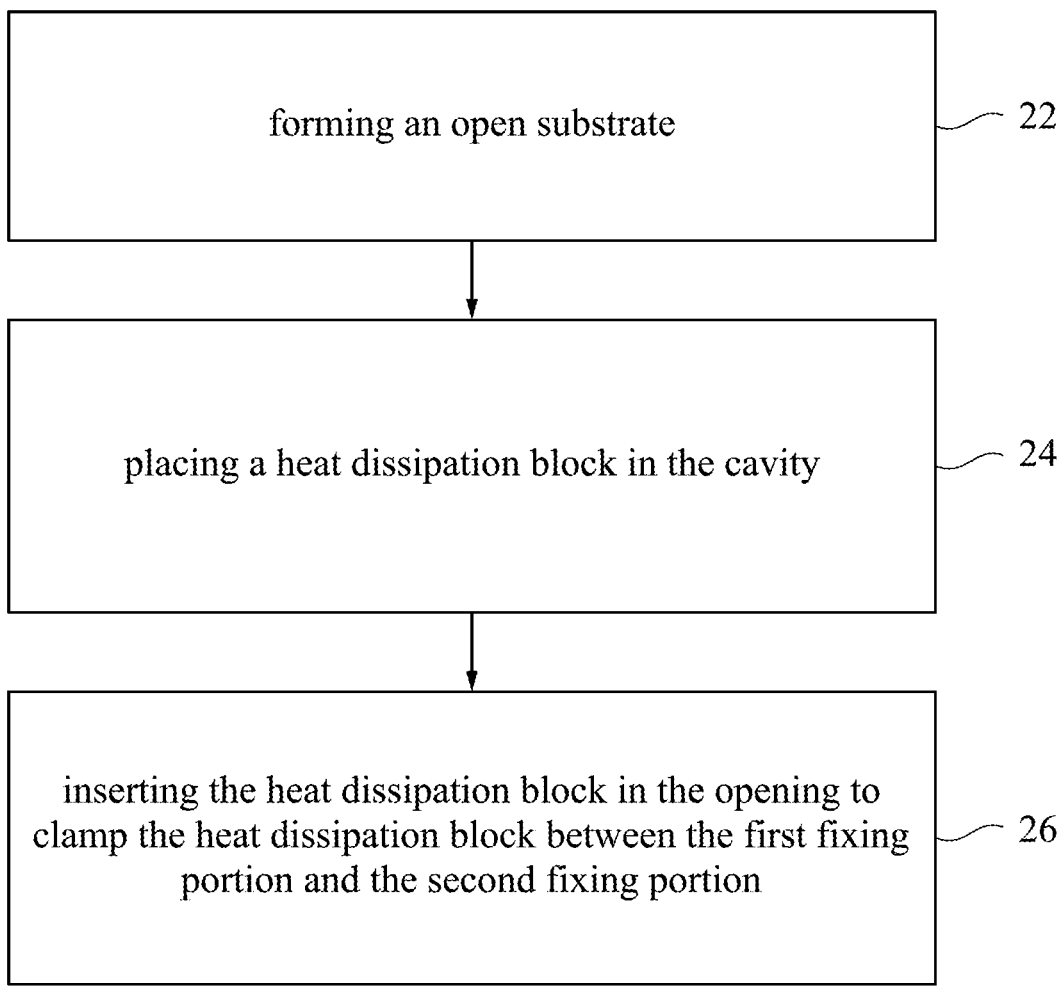
FIG. 12 is a flow chart of a method of manufacturing a circuit board having a heat dissipation block according to various embodiments of the present disclosure.

FIG. 12 is a flow chart of a method 20 of manufacturing a circuit board having a heat dissipation block according to various embodiments of the present disclosure. As shown in FIG. 12, the method 20 includes operations 22, 24 and 26. FIGS. 13-25 are respectively top views and cross-sectional views of a manufacturing method at various stages according to some embodiments of the present disclosure. It is noted that the method depicted in FIG. 12 is merely an example, and is not intended to limit the present invention. Accordingly, additional operations may be performed before, during, and/or after the method depicted in FIG. 12, and some other operations may only be briefly described herein.

Figure 13:
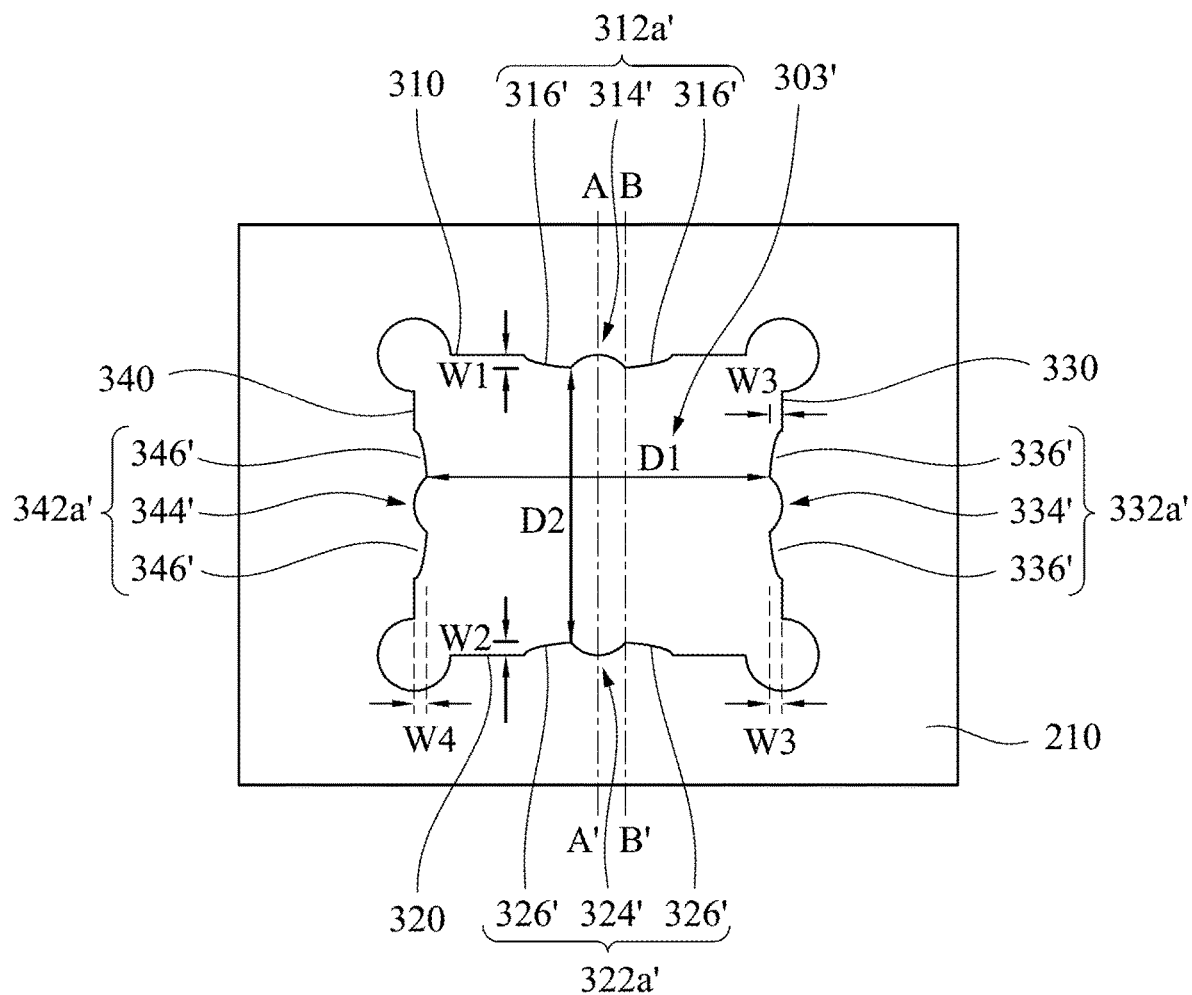
FIG. 13 is a top view of a manufacturing method at various stages according to some embodiments of the present disclosure.

Reference is made to FIG. 12 and FIG. 13. In the operation 22 of FIG. 12, an open substrate 203' is formed. As shown in FIG. 13, the open substrate 203' includes a substrate body 210, an opening 303', at least one first fixing portion 312a' and at least one second fixing portion 322a'. The top view of the open substrate 203' shown in FIG. 13 is same as the top view of the open substrate 203 shown in FIG. 5. However, the structure of the open substrate 203' is different from that of the open substrate 203 shown in FIG. 5, and the difference is described hereinafter.

Figure 14:
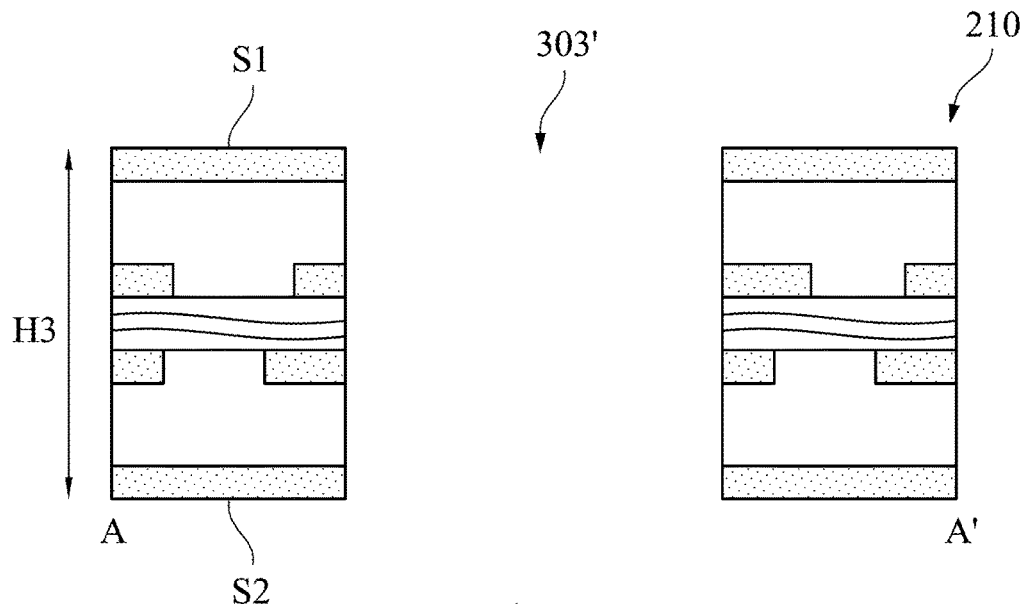
FIG. 14 is a cross-sectional view of the circuit board taken along line A-A' of FIG. 13.
Figure 15:
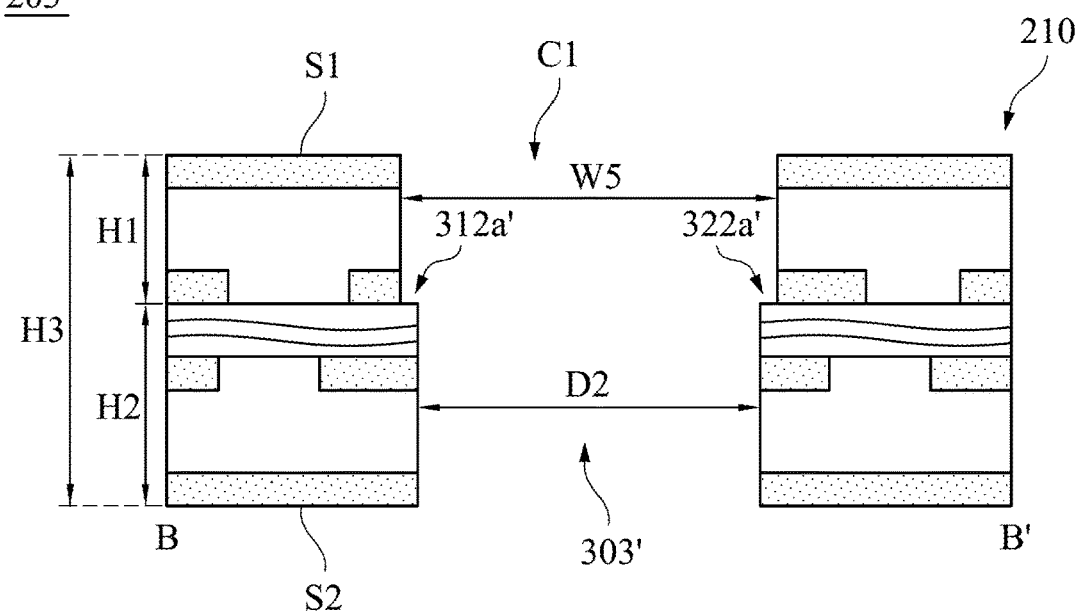
FIG. 15 is a cross-sectional view of the circuit board taken along line B-B' of FIG. 13.

FIG. 14 and FIG. 15 are respectively cross-sectional views of the open substrate 203' taken along line A-A' and line B-B' of FIG. 13. As shown in FIGS. 14-15, the substrate body 210 has a top surface S1 and a bottom surface S2. In some embodiments, substrate body 210 includes an insulating plate, a metal plate, or a wiring board, but is not limited thereto.

Reference is made to FIGS. 13-15. The opening 303' has a first sidewall 310, a second sidewall 320 opposite to the first sidewall 310, and a cavity C1 therein. The difference between the opening 303' shown in FIG. 13 and the opening 330 shown in FIG. 5 is that the opening 303' further includes the cavity C1 recessed from the top surface S1 of the open substrate 203'. In some embodiments, the process of forming the opening 303' may include drilling, laser, routing, punching, or a combination thereof, but is not limited thereto. In some embodiments, the opening 303' may be directly formed using the punching process.

In other embodiments, the formation of the opening 303' includes forming the opening 303 shown in FIG. 5 penetrating the substrate body 210, in which the opening 303 may have a vertical contour in cross-sectional view. The cavity C1 is then formed in the opening 303 by recessing the fixing portions (e.g., the first fixing portion 312a, the second fixing portion 322a, the third fixing portion 332a and the fourth fixing portion 342a shown in FIG. 5), thereby forming the opening 303'. As shown in FIG. 15, the cavity C1 communicates with the opening 303', and the cavity C1 has a width W5 that is wider than a distance D2 between the first fixing portion 312a' and the second fixing portion 322a'. Therefore, the opening 303' has a staircase contour in the cross-sectional view. In some embodiments, the cavity C1 may be formed in other openings by recessing the fixing portions shown in FIGS. 2-4 and FIGS. 6-7.

In some embodiments, a depth H1 of the cavity C1 is of about 0.2-0.5 of a thickness H3 of the substrate body 210. That is, the depth H1 of the cavity C1 may be smaller than or equal to a height H2 of the first fixing portion 312a' and the second fixing portion 322a'. It is noted that the cavity C1 shown in FIG. 15 is merely an example, the depth H1 of the cavity C1 can be adjusted depending on the thickness H3 of substrate body 210 and the thickness of the dissipation block to be placed in the opening 303'.

Referring back to FIG. 13. In some embodiments, four corners of the opening 303' have an arc-shaped profile recessed toward the substrate body 210. In some examples, the opening 303' has round corners at both ends of the first sidewall 310 and the second sidewall 320. In some embodiments, the opening 303' further has a third sidewall 330 and a fourth sidewall 340 opposite to each other, and the third sidewall 330 and the fourth sidewall 340 are connected to the first sidewall 310 and the second sidewall 320.

The first fixing portion 312a' and the second fixing portion 322a' extends from the substrate body 210 toward the opening 303'. The first fixing portion 312a' and the second fixing portion 322a' are respectively protruded from the first sidewall 310 and the second sidewall 320. The protruding first fixing portion 312a' and the second fixing portion 322a' may be used to fix a heat dissipation block in subsequent processes. The first fixing portion 312a' has a first width W1 protruding from the first sidewall 310, and the second fixing portion 322a' has a second width W2 protruding from the second sidewall 320. In some embodiments, the first width W1 and the second width W2 are in a range of from about 0.05 mm to about 0.5 mm.

In some embodiments, the first fixing portion 312a' has at least two first protrusions 316' and at least one first recess 314' located between the first protrusions 316', and the second fixing portion 322a' has at least two second protrusions 326' and at least one second recess 324' located between the second protrusions 326'. In some embodiments, each of the first protrusions 316' may be aligned with one of the second protrusions 326' to stably fix the heat dissipation block in subsequent processes. In some embodiments, the first recess 314' and the second recess 324' may be formed using a drilling process. It should be noted that although the first fixing portion 312a' and the second fixing portion 322a' respectively protrude from the longer first sidewall 310 and the second sidewall 320 of the opening 303', the present disclosure is not limited thereto. The first fixing portion 312a' and the second fixing portion 322a' may be disposed at the shorter third sidewall 330 and the fourth sidewall 340 of the opening 303', respectively.

As shown in FIG. 15, the first fixing portion 312a' and the second fixing portion 322a' are disposed under the cavity C1. In specific, the first fixing portion 312a' and the second fixing portion 322a' shown in FIG. 13 and FIG. 15 are thinned compared with the first fixing portion 312a and the second fixing portion 322a shown in FIG. 5. Therefore, the height H2 of the first fixing portion 312a' and the second fixing portion 322a' are respectively smaller than the thickness H3 of the substrate body 210.

Referring back to FIG. 13. In some embodiments, the open substrate 203' further includes at least one third fixing portion 332a' and at least one fourth fixing portion 342a'. The third fixing portion 332a' extends from the substrate body 210 of the open substrate 203' toward the opening 303' and protrudes from the third sidewall 330. The fourth fixing portion 342a' extends from the substrate body 210 of the open substrate 203' 202 toward the opening 303' and protrudes from the fourth sidewall 340. In some embodiments, the third fixing portion 332a' has a third width W3 protruding from the third sidewall 330, and the fourth fixing portion 342a' has a fourth width W4 protruding from the fourth sidewall 340, and the third width W3 and the fourth width W4 are in a range of from about 0.05 mm to about 0.5 mm. In some embodiments, the third width W3 and the fourth width W4 may be the same as the first width W1 and the second width W2. In other embodiments, the third width W3 and the fourth width W4 may be different from the first width W1 and the second width W2. In some embodiments, the third fixing portion 332a' and the fourth fixing portion 342a' respectively have a height that is substantially equal to the height H2 of the first fixing portion 312a' and the second fixing portion 322a'.

In some embodiments, the third fixing portion 332a' has at least two third protrusions 336' and at least one third recess 334' located between the third protrusions 336', and the fourth fixing portion 342a' has at least two fourth protrusions 346' and at least one fourth recess 344' located between the fourth protrusions 346'. The third protrusion 336' and the fourth protrusion 346' may be used to fix the heat dissipation block disposed in the opening 303' together with the first protrusions 316' and the second protrusions 326' in subsequent processes. In some embodiments, each of the third protrusions 336' may be aligned with one of the fourth protrusions 346'. In some embodiments, a distance D2 between the first fixing portion 312a' and the second fixing portion 322a' is same as a distance D1 between the third fixing portion 332a' and the fourth fixing portion 342a'. In other embodiments, the distance D1 is different from the distance D2. The distance D1 and the distance D2 may be selected according to the size of the heat dissipation block to be accommodated in the opening 303'.

Subsequent steps of the method 20 will be described below by taking the open substrate 203' shown in FIGS. 13-15 as an example.

Figure 16:
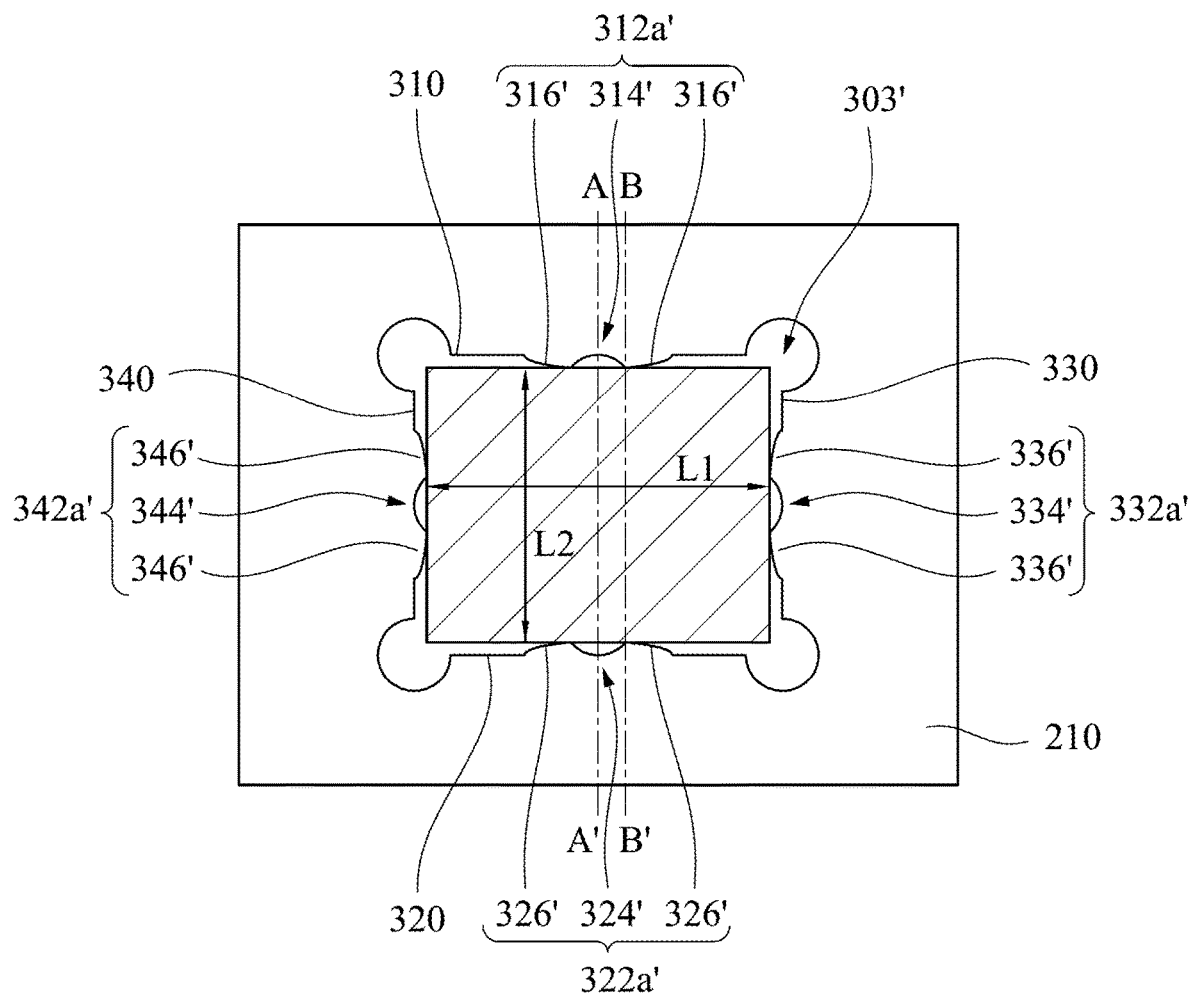
FIG. 16 is a top view of a manufacturing method at various stages according to some embodiments of the present disclosure.
Figure 17:
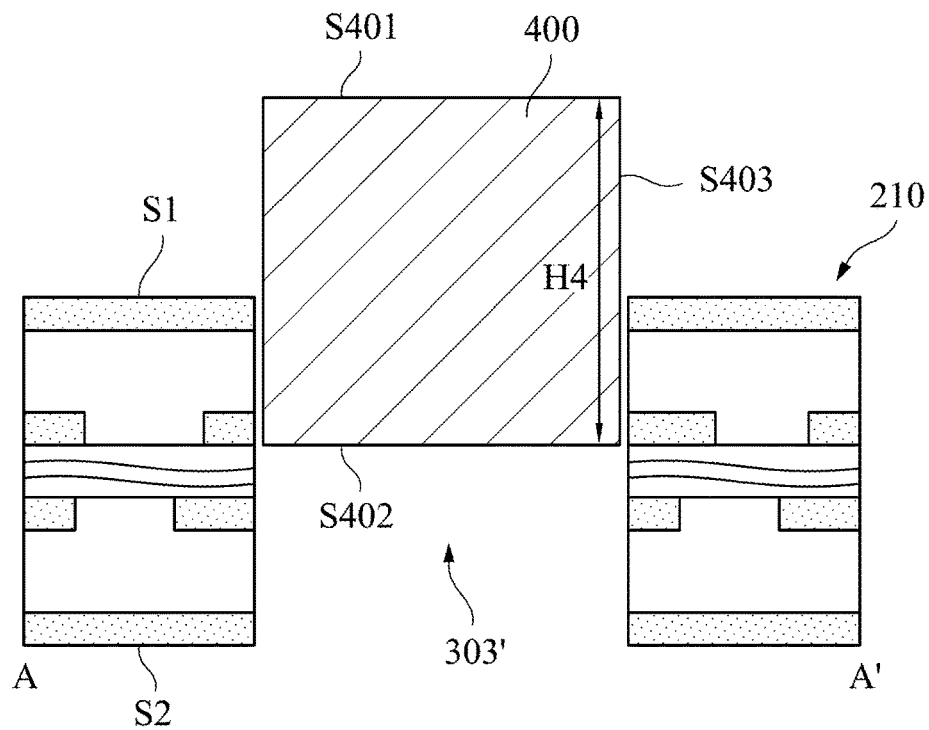
FIG. 17 is a cross-sectional view of the circuit board having the heat dissipation block taken along line A-A' of FIG. 16.
Figure 18:
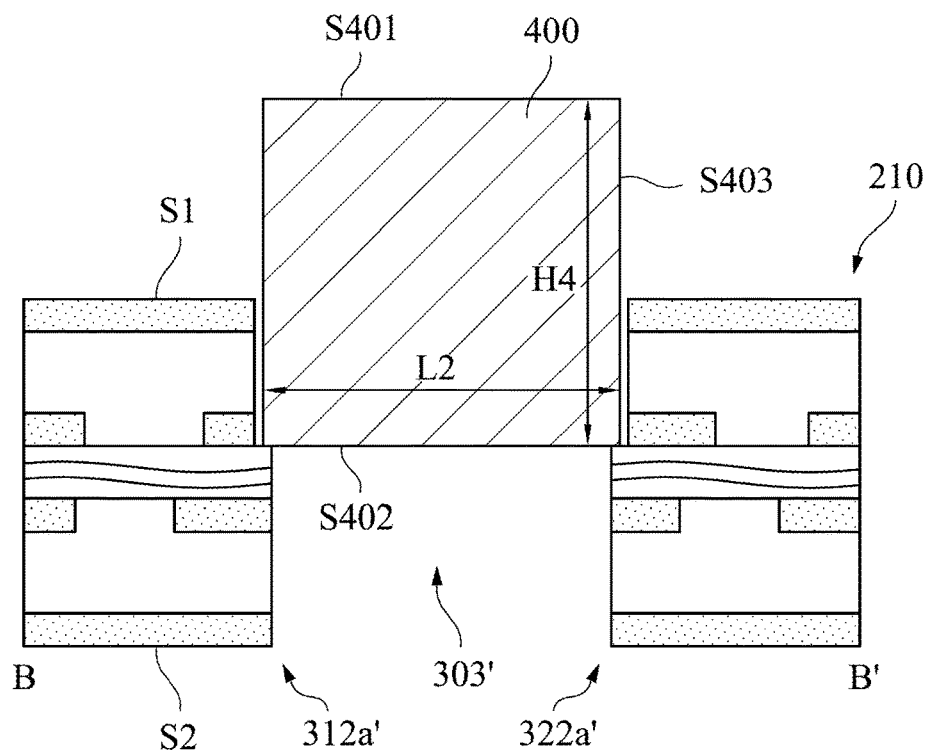
FIG. 18 is a cross-sectional view of the circuit board having the heat dissipation block taken along line B-B' of FIG. 16.

Reference is made to FIGS. 16-18. In the operation 24 of FIG. 12, a heat dissipation block 400 is placed in the cavity C1. FIG. 17 and FIG. 18 are respectively cross-sectional views taken along line A-A' and line B-B' of FIG. 16. As shown in FIG. 18, the heat dissipation block 400 is placed on the first fixing portion 312a' and the second fixing portion 322a'. Specifically, the heat dissipation block 400 may be temporary supported by the fixing portions (e.g. the first fixing portion 312a' and the second fixing portion 322a'). The heat dissipation block 400 has a top surface S401, a bottom surface S402 and a side surface S403 extending vertically from the top surface S401 to the bottom surface S402 and interconnected with thereof. In some embodiments, the entire side surface S403 of the heat dissipation block 400 is substantially flat. Since the depth H1 of the cavity C1 (shown in FIG. 15) is smaller than the thickness H4 of the heat dissipation block 400, the heat dissipation block 400 is protruded from the opening 303'. That is, the top surface S401 of the heat dissipation block 400 is above the top surface S1 of the open substrate 203'.

In some embodiments, the heat dissipation block 400 has a rectangular-shaped in top view, but is not limited thereto. The heat dissipation block 400 may have a length L1 parallel with the first sidewall 310 and a length L2 perpendicular to the length L1. In some embodiments, the length L2 is slightly greater than the distance D2 (shown in FIG. 18) between the first fixing portion 312a' and the second fixing portion 322a'. The length L1 may be slightly greater than the distance D1 (shown in FIG. 18) between the third fixing portion 332a' and the fourth fixing portion 342a'. In some embodiments, a distance between the first sidewall 310 and the second sidewall 320 is greater than the width W5 of cavity C1 (shown in FIG. 15) which is greater than the length L2 of the heat dissipation block 400. Similarly, a distance between the third sidewall and the fourth sidewall may be greater than a width of the cavity C1 parallel to the first sidewall 310 which is greater than the length L1 of the heat dissipation block 400. In some embodiments, the width W5 of the cavity C1 is of about 1.03-1.1 of the length L2 of the heat dissipation block 400.

In some embodiments, the heat dissipation block 400 includes a ceramic or composite material. For example, the entire heat dissipation block 400 may be ceramic or composite material. The ceramic or composite material may have low coefficient of thermal expansion, which is relatively close to the substrate, compared with heat dissipation block 400 made of metal material. Therefore, structural defect due to mismatch of thermal expansion coefficient between the substrate body 210 and the heat dissipation block 400 can be avoided. In some embodiments, the heat dissipation block 400 is selected from one of the group consisting of aluminum silicon carbide (AlSiC), tungsten copper alloy (CuW), tungsten molybdenum alloy (CuMo), silicon carbide (SiC), silicon nitride (AlN), beryllia, chemical vapor deposition diamond (CVD diamond), diamond powder-doped copper, diamond powder-doped aluminum, carbon-based nano-aluminum composite material (CarbAl-N) and carbon-based nano-aluminum composite material (CarbAl-G). In some embodiments, CuW includes 10-20% copper (Cu). In some embodiments, CuMo includes 15-20% molybdenum (Mo). In some embodiments, the heat dissipation block 400 includes aluminum nitride, aluminum carbide, aluminum silicon carbide, or a combination thereof, but is not limited thereto. The heat dissipation block 400 may be other materials having a low coefficient of thermal expansion (e.g., less than 10 ppm/K) and low ductility. In some embodiments, the heat dissipation block 400 may have a metal layer (not shown) formed using a sputtering and/or plating process on its upper and lower surfaces.

Figure 19:
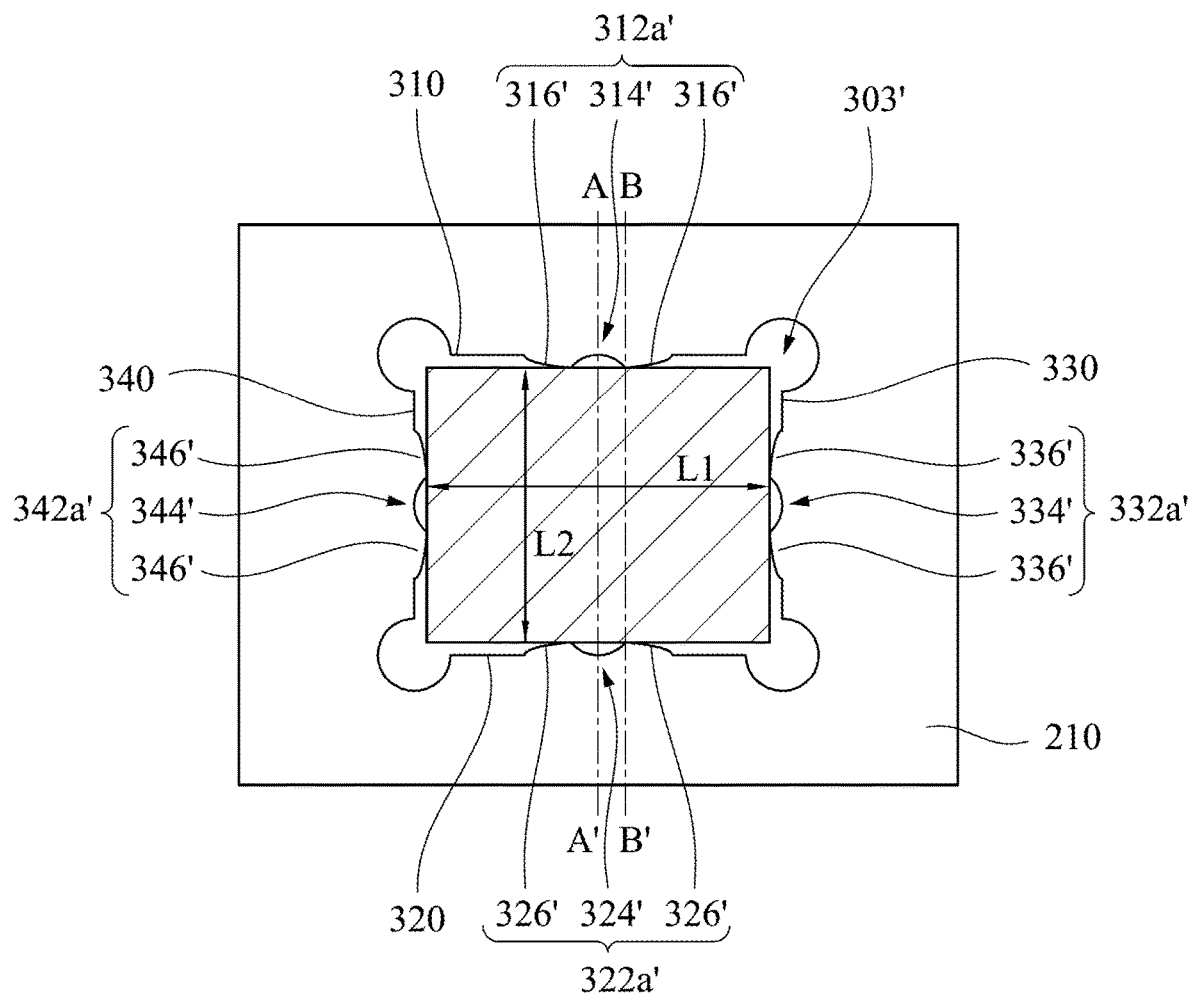
FIG. 19 is a top view of a manufacturing method at various stages according to some embodiments of the present disclosure.
Figure 20:
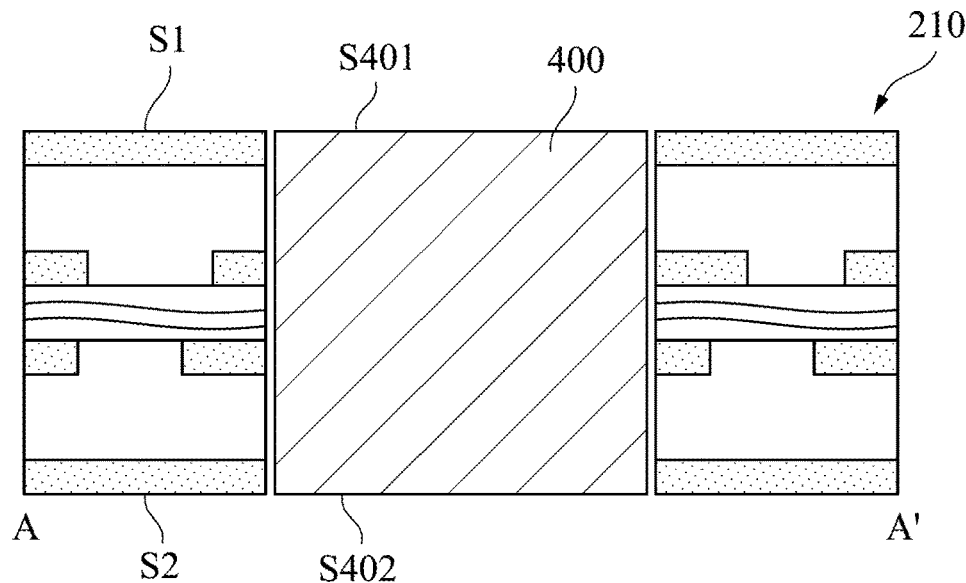
FIG. 20 is a cross-sectional view of a manufacturing method taken along line A-A' of FIG. 16.
Figure 21:
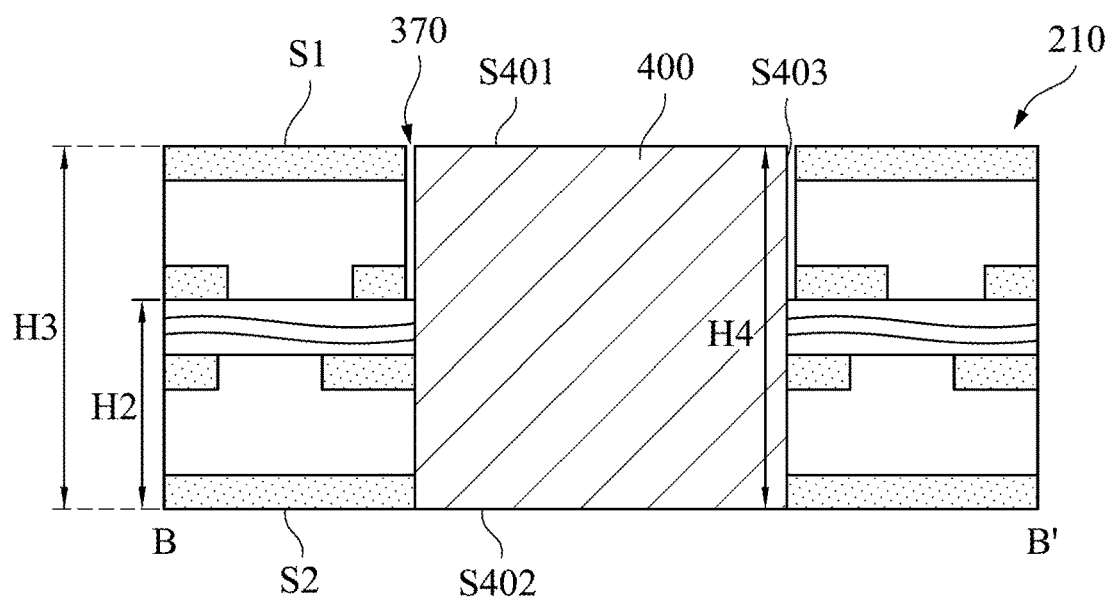
FIG. 21 is a cross-sectional view of a manufacturing method taken along line B-B' of FIG. 16.

Reference is made to FIGS. 19-21. In the operation 26 of FIG. 12, the heat dissipation block 400 is inserted in the opening 303' to clamp the heat dissipation block between the first fixing portion 312a' and the second fixing portion 322a'. FIG. 20 and FIG. 21 are respectively cross-sectional views taken along line A-A' and line B-B' of FIG. 19. In some embodiments, the heat dissipation block 400 protruded from the opening 303' is pressed from its top surface S401 (shown in FIG. 18), such that the heat dissipation block 400 is squeeze into the opening 303' between the first fixing portion 312a' and the second fixing portion 322a'. Therefore, the heat dissipation block 400 is directly fixed in the opening 303' without using adhesive. As such, the circuit board 1000' is formed.

As shown in FIG. 19, the first protrusion 316' of the first fixing portion 312a' and the second protrusion 326' of the second fixing portion 322a' are in contact with the heat dissipation block 400. In some embodiments, the heat dissipation block 400 may also be clamped between the third fixing portion 332a' and the fourth fixing portion 342a'. Similarly, the third protrusions 336' of the third fixing portion 332a' and the fourth protrusions 346' of the fourth fixing portion 342a' are in contact with the heat dissipation block 400.

As shown in FIG. 19, a first recess 314' may be located between the two first protrusions 316' and the heat dissipation block 400, and the second recess 324' may be located between the two second protrusions 326' and the heat dissipation block 400. Similarly, the third recess 334' may be located between the two third protrusions 336' and the heat dissipation block 400, and the fourth recess 344' may be located between the two fourth protrusions 346' and the heat dissipation block 400. A first gap 350 may be formed between the heat dissipation block 400 and the first sidewall 310 of the opening 303', and a second gap 360 may be formed between the heat dissipation block 400 and the second sidewall 320 of the opening 303'.

As shown in FIG. 19 and FIG. 21, a bottom portion of the heat dissipation block 400 is tight contact with the first fixing portion 312a' and the second fixing portion 322a'. The heat dissipation block 400 is fixed in the opening 303' by the length L2 of the heat dissipation block 400 being slightly larger than the distance D2 (shown in FIG. 18) between the first fixing portion 312a' and the second fixing portion 322a'. Similarly, the heat dissipation block 400 may be fixed in the opening 303' by the length L1 of the heat dissipation block 400 being slightly larger than the distance D1 (shown in FIG. 18) between the third fixing portion 332a' and the fourth fixing portion 342a'. In addition, because of the height H2 of the first fixing portion 312a' and the second fixing portion 322a' are smaller than that of the heat dissipation block 400, the damage of the heat dissipation block 400 having low ductility and the open substrate 203' can be avoid when the heat dissipation block 400 is inserted into the open substrate 203'. That is, the heat dissipation block 400 may be more easily to be pressed into opening 303' compared with the opening 303 shown in FIG. 5.

In some embodiments, apertures 370 may be formed between the sidewall S403 of the heat dissipation block 400 and a sidewall of the cavity C1. The apertures 370 is on the first fixing portion 312a' and the second fixing portion 322a'. In some embodiments, the apertures has a depth of about 0.2-0.5 of a thickness of the substrate body. In some embodiments, the thickness H4 of the heat dissipation block 400 is substantially equal to the thickness H3 of the substrate body 210. Specifically, the top surface S401 and the bottom surface S402 of the heat dissipation block 400 may be respectively level with a top surface S1 and a bottom surface S2 of the substrate body 210. The working heat source generated by the electronic components (not shown) on the circuit board may be transmitted to outside of the circuit board 1000' through heat conduction characteristics of the heat dissipation block 400 to maintain working performance of the electronic components and maintain their life.

Figure 22:
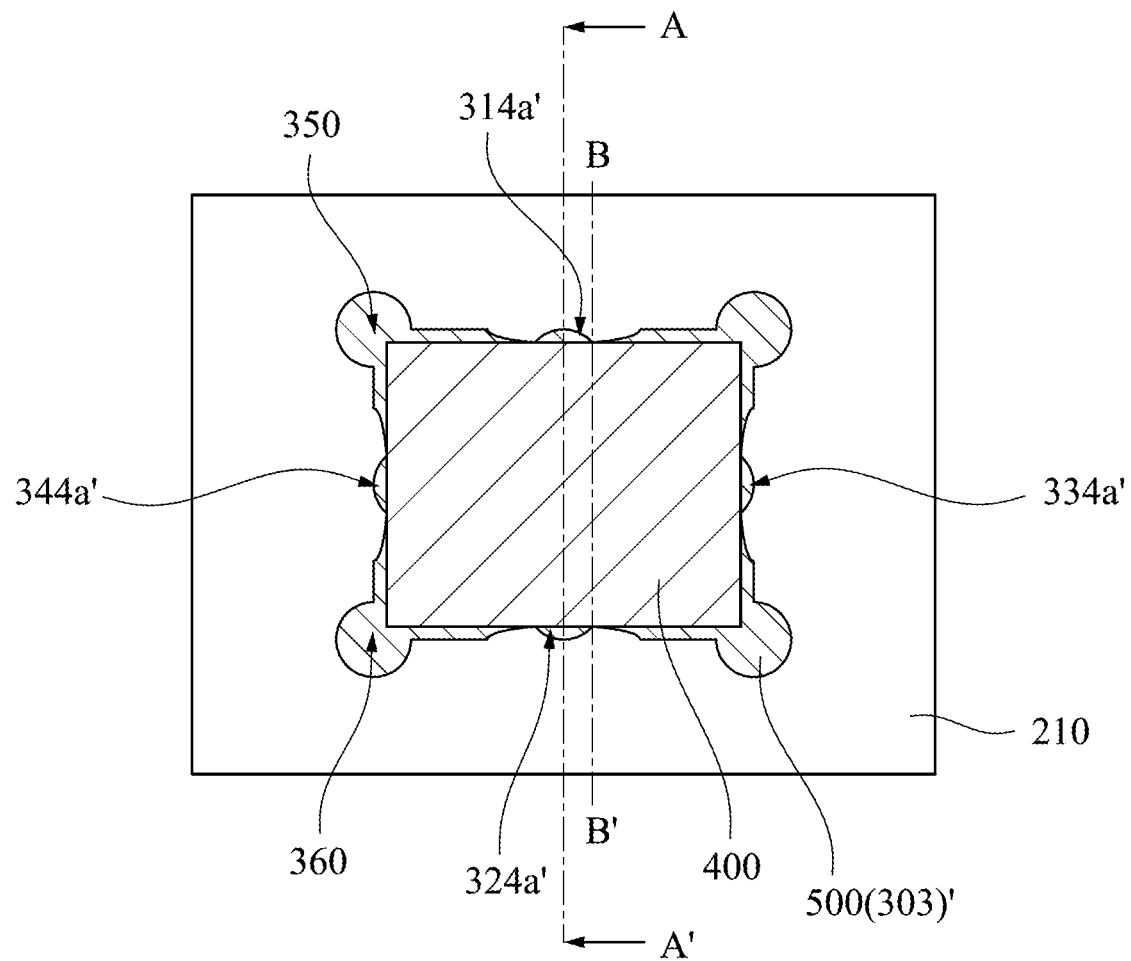
FIG. 22 is a top view of a manufacturing method at various stages according to some embodiments of the present disclosure.

In some embodiment, after the operation 26 is completed, the method 20 may include other operations or steps. Reference is made to FIG. 22, which is a top view of a process stage after the operation 26 according to some embodiments of the present disclosure. In some embodiments, the method 20 further includes filling a resin material 500 in the remaining opening 303' (shown in FIG. 19). Specifically, the resin material 500 is filled in the apertures 370, the first gap 350, the second gap 360, the first recess 314', and the second recess 324'. In some embodiments, the method 20 further includes filling the resin material 500 in the third recess 334' and the fourth recess 344'. As shown in FIG. 22, all of the spaces between the heat dissipation block 400 and the substrate body 210 may be filled with the resin material 500, so that the heat dissipation block 400 is fixed in the opening 303' to facilitate subsequent processes performed on the circuit board 2000'. It is noted that filling the resin material 500 in the remaining opening 303' is an optional operation that can help the heat dissipation block 400 more firmly fixed in the opening 303'.

Figure 23:
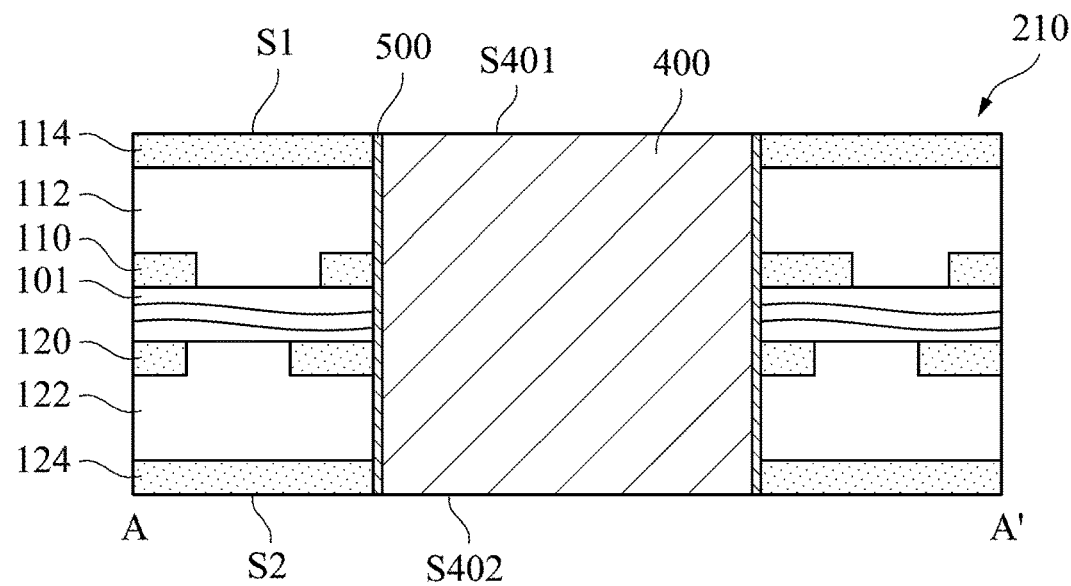
FIG. 23 is a cross-sectional view of the circuit board having the heat dissipation block taken along line A-A' of FIG. 22.
Figure 24:
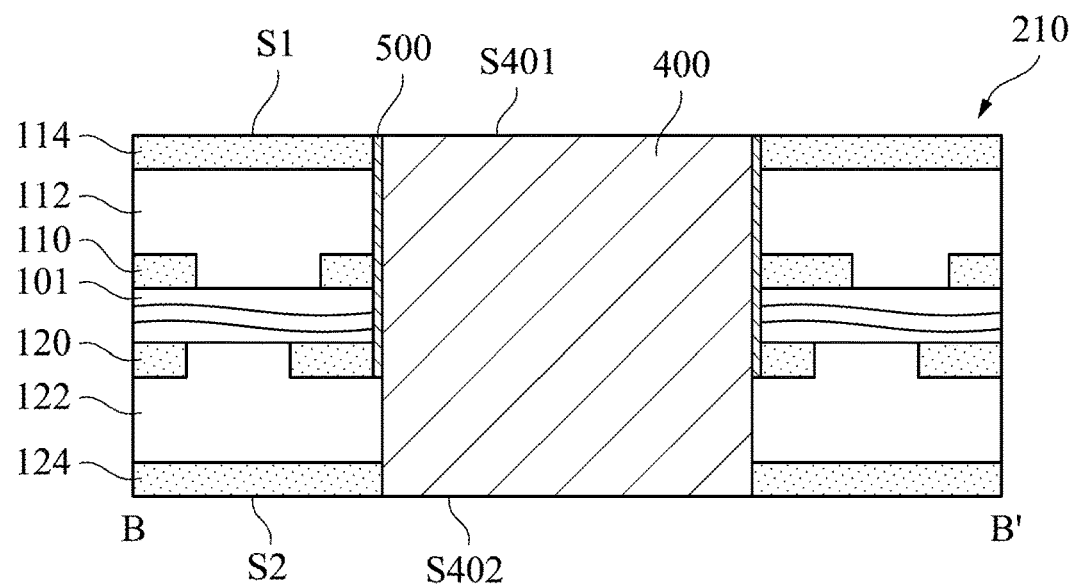
FIG. 24 cross is a cross-sectional view of the circuit board having the heat dissipation block taken along line B-B' of FIG. 22.

FIG. 23 and FIG. 24 are respectively cross-sectional view taken along line A-A' and line B-B' of FIG. 22. Reference is made to FIG. 23 and FIG. 24. In some embodiments, the circuit board 2000' may be a multi-layered circuit board. For example, the substrate body 210 includes a core plate 101, a first circuit layer 110, a second circuit layer 120, a first dielectric layer 112, a second dielectric layer 122, a first conductive layer 114, and a second conductive layer 124. It should be understood that the structure of the substrate body 210 is not limited to that shown in FIG. 23 and FIG. 24, and the substrate body 210 may be any circuit board having a multilayered structure.

Figure 25:
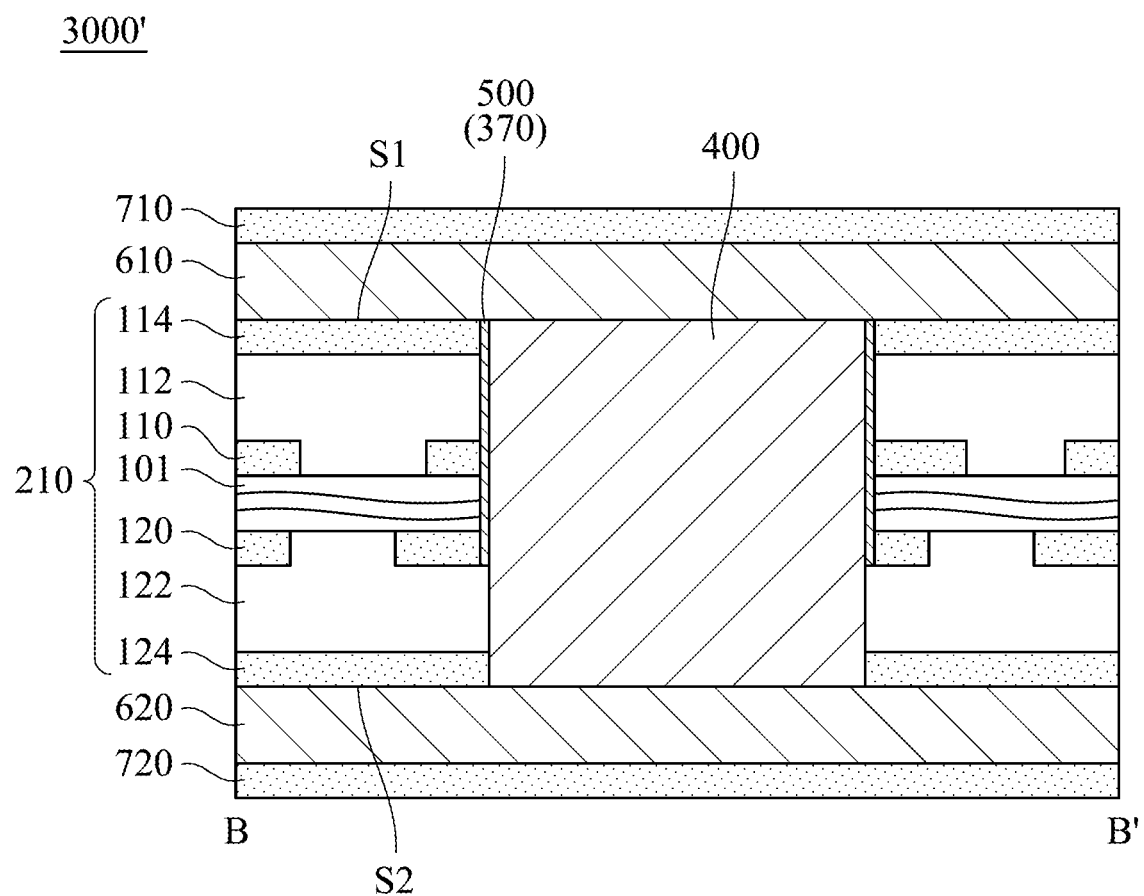
FIG. 25 is a cross-sectional view of the circuit board having the heat dissipation block.

Reference is made to FIG. 25, which is a cross-sectional view taken along line B-B' of FIG. 22 following the FIG. 24. In some embodiments, a third dielectric layer 610 and a fourth dielectric layer 620 are further formed over the top surface S1 and the bottom surface S2 of the substrate body 210, respectively. A third conductive layer 710 is further formed over the third dielectric layer 610 and a fourth conductive layer 720 is further formed beneath the fourth dielectric layer 620. As shown in FIG. 25, the third dielectric layer 610 and the fourth dielectric layer 620 may be prepregs or other dielectric materials having fluidity. The third dielectric layer 610 and the fourth dielectric layer 620 may be filled in the first recess 314' and the second recess 324'. In some embodiments, the third dielectric layer 610 and the fourth dielectric layer 620 may also fill in all of the spaces between the heat dissipation block 400 and the open substrate 203' shown in FIG. 16, such as apertures 370, the first gap 350, the second gap 360, the third recess 334', and the fourth recess 344'. In some embodiments, the third conductive layer 710 and the fourth conductive layer 720 may be copper foils.

As described above, according to the embodiments of the present disclosure, the method of manufacturing the circuit board having the heat dissipation block is provided. The heat dissipation block can be directly fixed in the opening by the specific open substrate shape. In specific, the heat dissipation block can be directly clamp between the fixing portions with the specific structure of the open substrate without using an additional adhesive layer on the bottom of the substrate body before inserting the heat dissipation block in the opening. Since the heat dissipation block has been fixed by the fixing portions of the open substrate, the position of the heat dissipation block does not shift during the subsequent processes. Therefore, compared with conventional method, the method of the present disclosure can avoid the problems of the offset heat dissipation block and air bubble residue generated by using adhesive layer to fix heat dissipation block, and the heat dissipation quality of the circuit board may be improved. In addition, the present disclosure use heat dissipation block made of ceramics or other composite materials which are different from the commonly used copper heat dissipation block, so that provide a diverse selection of the heat dissipation block material. The ceramics or other composite materials have low processability, low thermal expansion coefficient and good thermal conductivity, such that structural defect due to mismatch of thermal expansion coefficient between the circuit board and the heat dissipation block can be avoided.

The present disclosure has been disclosed in the above embodiments, and is not intended to limit the present disclosure, and it is obvious to those skilled in the art that various alternations and modifications may be made without departing from the spirit and scope of the present disclosure. The scope of the present disclosure is defined by the scope of the appended claims.

What is claimed is:

1. A circuit board, comprising:
   an open substrate having a thickness, comprising:
   a substrate body having a top surface and a bottom surface;
   an opening in the substrate body, wherein the opening has a first sidewall and a second sidewall opposite to the first sidewall;
   at least one first fixing portion and at least one second fixing portion extending from the substrate body toward the opening, wherein the first fixing portion and the second fixing portion are respectively protruded from the first sidewall and the second sidewall and have a height smaller than the thickness of the open substrate, wherein the first fixing portion and the second fixing portion comprise a conductive layer; and
   an aperture on the first fixing portion and the second fixing portion along a thickness direction of the open substrate; and
   a heat dissipation block directly clamped between the first fixing portion and the second fixing portion and in contact with the conductive layer, wherein the heat dissipation block includes ceramic or a composite material.

2. The circuit board of claim 1, wherein a bottom portion of the heat dissipation block is tight contact with the first fixing portion and the second fixing portion.

3. The circuit board of claim 1, wherein the aperture has a depth of about 0.2-0.5 of a thickness of the substrate body.

4. The circuit board of claim 1, wherein the top surface of the substrate body is level with a top surface of the heat dissipation block.

5. The circuit board of claim 1, wherein the first fixing portion has a first width protruding from the first sidewall, and the second fixing portion has a second width protruding from the second sidewall, wherein the first width and the second width are in a range of from about 0.05 mm to about 0.5 mm.

6. The circuit board of claim 1, wherein the first fixing portion has at least two first protrusions in contact with the heat dissipation block and at least one first recess located between the first protrusions and the heat dissipation block, and the second fixing portion has at least two second protrusions in contact with the heat dissipation block and at least one second recess located between the second protrusions and the heat dissipation block.

7. The circuit board of claim 1, wherein the open substrate further includes at least one third fixing portion and at least one fourth fixing portion extending from the substrate body toward the opening, and the heat dissipation block is clamped between the third fixing portion and the fourth fixing portion.

8. The circuit board of claim 1, wherein the opening has round corners at both ends of the first sidewall and the second sidewall.

9. The circuit board of claim 1, wherein the heat dissipation block is selected from one of the group consisting of aluminum silicon carbide (AlSiC), tungsten copper alloy (CuW), tungsten molybdenum alloy (CuMo), silicon carbide (SiC), silicon nitride (AlN), beryllia, chemical vapor deposition diamond (CVD diamond), diamond powder-doped copper, diamond powder-doped aluminum, carbon-based nano-aluminum composite material (CarbAl-N) and carbon-based nano-aluminum composite material (CarbAl-G).

* * * * *